(12) United States Patent
Chang et al.

(10) Patent No.: US 8,760,192 B2
(45) Date of Patent: Jun. 24, 2014

(54) PROGRAMMABLE CIRCUIT INCLUDING DIFFERENTIAL AMPLIFIER CIRCUIT

(75) Inventors: Dong-Ryul Chang, Suwon-si (KR); Hwa-Sook Shin, Hwaseong-si (KR); Hoon-Jin Bang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 25 days.

(21) Appl. No.: 13/538,035

(22) Filed: Jun. 29, 2012

(65) Prior Publication Data

US 2013/0002294 A1    Jan. 3, 2013

(30) Foreign Application Priority Data

Jun. 30, 2011    (KR) ................ 10-2011-0065036

(51) Int. Cl.
     *H03K 19/173*      (2006.01)
(52) U.S. Cl.
     USPC ............................................ 326/38; 326/49
(58) Field of Classification Search
     None
     See application file for complete search history.

(56) References Cited

U.S. PATENT DOCUMENTS

| | | | |
|---|---|---|---|
| 7,706,202 B2 | 4/2010 | Obayashi et al. | |
| 2003/0123301 A1* | 7/2003 | Jang et al. | 365/200 |
| 2007/0182458 A1* | 8/2007 | Park et al. | 327/51 |
| 2010/0165775 A1 | 7/2010 | Obayashi et al. | |
| 2011/0001552 A1 | 1/2011 | Shin et al. | |

FOREIGN PATENT DOCUMENTS

| | | |
|---|---|---|
| JP | 2007-317882 | 12/2007 |
| JP | 2011-014220 | 1/2011 |
| KR | 1020070114046 | 11/2007 |
| KR | 1020080046510 | 5/2008 |
| KR | 1020110002305 | 1/2011 |

\* cited by examiner

*Primary Examiner* — Jany Richardson
(74) *Attorney, Agent, or Firm* — Stanzione & Kim, LLP

(57) ABSTRACT

Provided is a programmable circuit. The programmable circuit includes a first path and a second path connected in parallel between a first voltage node and a second voltage node. The first path includes a first programmable element, a first node, a first pull-up transistor, a second node, and a first pull-down transistor connected in series between the first voltage node and the second voltage node. The second path includes a second programmable element, a third node, a second pull-up transistor, a fourth node, and a second pull-down transistor connected in series between the first and second voltage nodes. A gate electrode of the first pull-up transistor, a gate electrode of the first pull-down transistor, and the fourth node are electrically connected to one another. A gate electrode of the second pull-up transistor, a gate electrode of the second pull-down transistor, and the second node are electrically connected to one another.

18 Claims, 14 Drawing Sheets

PROGRAMMABLE CIRCUIT INCLUDING DIFFERENTIAL AMPLIFIER CIRCUIT

CROSS-REFERENCE TO RELATED APPLICATIONS

This application claims priority under 35 U.S.C. §119(a) from Korean Patent Application No. 10-2011-0065036 filed with the Korean Intellectual Property Office on Jun. 30, 2011, the disclosure of which is incorporated herein by reference.

BACKGROUND

1. Field of the Invention

The general inventive concept relate to a programmable circuit and a semiconductor circuit and electronic system including the same.

2. Description of the Related Art

Fuses are utilized in electrical systems to halt current flow and mitigate damage of an electrical system if one or more electrical circuits abnormally behave or fail. A conventional electrical fuse using current includes a resistive conductive interconnection line formed of, for example, Si. The interconnection line may be cut in response to an overcurrent, thereby effectively halting current flow therethrough. However, the overcurrent may still adversely affect electrical devices connected near the electrical fuse.

SUMMARY

Exemplary embodiments of the present general inventive concept provide a programmable circuit.

Other exemplary embodiments of the present general inventive concept provide a semiconductor circuit and various electronic systems including the programmable circuit.

Still other exemplary embodiments of the present general inventive concept provide a programmed circuit.

Yet other exemplary embodiments of the present general inventive concept provide a semiconductor circuit and various electronic systems including the programmed circuit.

Features of the present general inventive concept should not be limited by the above description, and other unmentioned features will be clearly understood by one of ordinary skill in the art from example exemplary embodiments described herein.

In accordance with a feature of the present general inventive concept, a programmable circuit includes a first path and a second path connected in parallel between a first voltage node and a second voltage node. The first path includes a first programmable element, a first node, a first pull-up transistor, a second node, and a first pull-down transistor connected in series between the first voltage node and the second voltage node. The second path includes a second programmable element, a third node, a second pull-up transistor, a fourth node, and a second pull-down transistor connected in series between the first voltage node and the second voltage node. A gate electrode of the first pull-up transistor, a gate electrode of the first pull-down transistor, and the fourth node are electrically connected to one another. A gate electrode of the second pull-up transistor, a gate electrode of the second pull-down transistor, and the second node are electrically connected to one another.

The first programmable element may include a first programmable field-effect transistor (FET).

The first programmable FET may include a gate electrode, a source electrode, a drain electrode, and a bulk. The gate electrode of the first programmable FET may be electrically connected to the first voltage node. The bulk of the first programmable FET may be electrically connected to the first node.

The source and drain electrodes of the first programmable FET may be electrically connected to the bulk of the first programmable FET.

The second programmable element may include a second programmable FET.

The second programmable FET may include a gate electrode, a source electrode, a drain electrode, and a bulk. The gate electrode of the second programmable FET may be electrically connected to the first voltage node. The bulk of the second programmable FET may be electrically connected to the third node.

The source and drain electrodes of the second programmable FET may be electrically connected to the bulk of the second programmable FET.

The programmable circuit may further include a first input transistor having a drain electrode electrically connected to the third node.

The programmable circuit may further include a second input transistor having a drain electrode electrically connected to the first node.

The programmable circuit may further include an output transistor having a source electrode electrically connected to the fourth node.

The programmable circuit may further include a first setting transistor electrically connected between the second node and the second voltage node.

The programmable circuit may further include a second setting transistor electrically connected between the fourth node and the second voltage node.

The programmable circuit may further include a complementary output node electrically connected to the fourth node. The complementary output node may include an inverter.

In accordance with another feature of the present general inventive concept, a programmable circuit includes a differential amplifier circuit including a common voltage node, a first pull-up transistor, and a second pull-up transistor, a first programmable element electrically connected between the common voltage node and the first pull-up transistor, and a second programmable element electrically connected between the common voltage node and the second pull-up transistor.

The first programmable element may include a first FET, and the second programmable element may include a second FET. The first FET may include a first gate electrode electrically connected to the common voltage node and a first bulk electrically connected to the first pull-up transistor. The second FET may include a second electrode electrically connected to the common voltage node and a second bulk electrically connected to the second pull-up transistor.

Additional features and utilities of the present general present general inventive concept will be set forth in part in the description which follows and, in part, will be obvious from the description, or may be learned by practice of the present general inventive concept.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION

Figure 1:
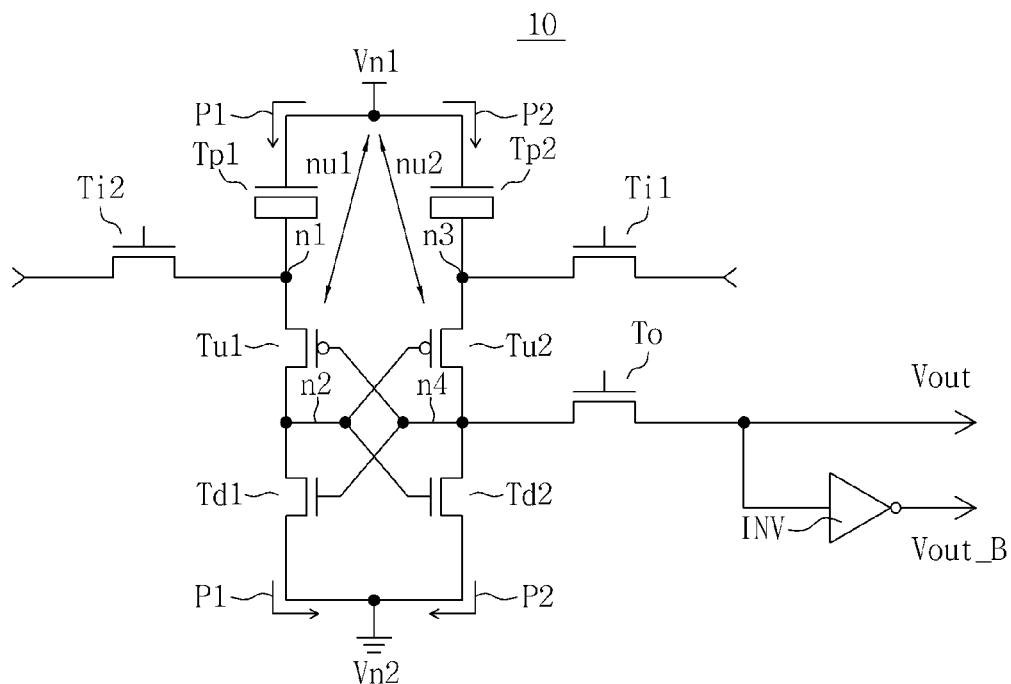
FIG. 1 is a circuit diagram of a programmable circuit according to embodiments of the present general inventive concept.

Reference will now be made in detail to the exemplary embodiments of the present general inventive concept, examples of which are illustrated in the accompanying drawings, wherein like reference numerals refer to the like elements throughout. The exemplary embodiments are described below in order to explain the present general inventive concept while referring to the figures.

In the specification, "electrical connection between A and B" may include resistive connection between A and B using a conductive interconnection and coupling of A and B using a capacitor. That is, the electrical connection between A and B may include both direct-current (DC) connection and an alternating-current (AC) connection.

In the specification, a term "programmable" refers to a capability to always output a constant logic value when programmed. For example, a programmable circuit may be programmed to output a logic "H" value or logic "L" value as a user wants. The programmable circuit may be programmed in various manners, including but not limited to, the user and a programming control circuit. Accordingly, a "programmed circuit" may refer to a circuit configured to output a logic "H" value or logic "L" value.

A "programmable" circuit is may be used as a "programmed" circuit. Accordingly, the term "programmable" used in the specification may be understood to carry the meaning of "programmed." That is, although a "programmed" circuit is used in an actual device, the "programmed" circuit may be described using the term "programmable" in the specification.

In the specification, a programmable transistor may refer to a transistor to which a high voltage is applied to break down a gate insulating layer of the transistor so that a gate electrode and bulk of the transistor may be electrically connected to each other. The programmable transistor may include a gate insulating layer having a very small thickness. A method of breaking down the programmable transistor may include applying a high potential difference between the gate electrode and bulk of the programmable transistor. When the high potential difference is applied between the gate electrode and bulk of the programmable transistor, electrons may move from the gate electrode toward the bulk or from the bulk toward the gate electrode and collide with combined atoms of the gate insulating layer so that the gate insulating layer may be physically and/or electrically broken down. For example, a Fowler-Nordheim effect may be applied. When the gate insulating layer is broken down, an electrical short may occur between the gate electrode and the bulk so that the programmable transistor may operate as a resistive device. The programmed transistor may short or open an electrical circuit. For instance, the programmed transistor may serve as an electrical fuse.

It may be understood that source electrodes and drain electrodes of transistors exemplarily described in the specification are interchangeable.

In the specification, it may be understood that a turn-on voltage Von is an operation voltage or a logic "H" voltage, while a turn-off voltage is a ground voltage or logic "L" voltage.

FIG. 1 is a circuit diagram of a programmable circuit according to exemplary embodiments of the present general inventive concept, which refers to an unprogrammed arbitrary state.

Referring to FIG. 1, a programmable circuit 10 may include a first path P1 and a second path P2 connected in parallel between a first voltage node Vn1 and a second voltage node Vn2. The first voltage node Vn1 may include a power node, a supply voltage node, an operating voltage node, or a logic "High (H)" node. The second voltage node Vn2 may include various reference voltage nodes, a ground node (=0 volt), or a logic "Low (L)" node. The terms "power node," "supply voltage node," "operating voltage node," and "logic 'high (H)' node" mean that various voltages may be applied according to an operating state of the programmable circuit 10. Similarly, the terms "reference voltage node," "ground node," and "logic 'low (L)' node" mean that various voltage levels may be applied according to an operating state of the programmable circuit 10.

The first path P1 may include the first voltage node Vn1, a first node n1, a second node n2, and the second voltage node Vn2 connected in series. The second path P2 may include the first voltage node Vn1, a third node n3, a fourth node n4, and the second voltage node Vn2.

A first programmable element Tp1 may be disposed between the first voltage node Vn1 and the first node n1. The first programmable element Tp1 may include a field effect transistor having a gate insulating layer between a gate electrode and a substrate. For example, the first programmable element Tp1 may include, but is not limited to, an N-type FET, i.e., an NMOS transistor. That is, the first programmable element Tp1 may be expressed as a first programmable transistor Tp1 and illustrated as an NMOS transistor, as referenced further below.

The first voltage node Vn1 may be electrically connected to a gate electrode of the first programmable transistor Tp1. The first node n1 may be electrically connected to a bulk of the first programmable transistor Tp1. Source and drain electrodes of the first programmable transistor Tp1 may be electrically connected to the bulk of the first programmable transistor Tp1.

A first pull-up transistor Tu1 may be disposed between the first and second nodes n1 and n2. The first pull-up transistor Tu1 may include a PMOS transistor. The first node n1 may be electrically connected to a source electrode of the first pull-up transistor Tu1. A drain electrode of the first pull-up transistor Tu1 may be electrically connected to the second node n2.

A first pull-down transistor Td1 may be disposed between the second node n2 and the second voltage node Vn2. The first pull-down transistor Td1 may include an NMOS transistor. The second node n2 may be electrically connected to a drain electrode of the first pull-down transistor Td1. A source electrode of the first pull-down transistor Td1 may be electrically connected to the second voltage node Vn2.

A gate electrode of the first pull-up transistor Tu1 may be electrically connected to a gate electrode of the first pull-down transistor Td1. Both the gate electrode of the first pull-up transistor Tu1 and the gate electrode of the first pull-down transistor Td1 may be electrically connected to the fourth node n4.

A second programmable element Tp2 may be disposed between the first voltage node Vn1 and the third node n3. The second programmable element Tp2 may include a field effect transistor (FET) having a gate insulating layer between a gate electrode and a substrate. For example, the second programmable element Tp2 may include, but not limited to, an NMOS transistor. That is, the second programmable element Tp2 may be expressed as a second programmable transistor Tp2, as referenced further below.

The first voltage node Vn1 may be electrically connected to a gate electrode of the second programmable transistor Tp2. The third node n3 may be electrically connected to a bulk of the second programmable transistor Tp2. Source and drain electrodes of the second programmable transistor Tp2 may be electrically connected to the bulk of the second programmable transistor Tp2.

A second pull-up transistor Tu2 may be disposed between the third and fourth nodes n3 and n4. The second pull-up transistor Tu2 may include a PMOS transistor. The third node n3 may be electrically connected to a source electrode of the second pull-up transistor Tu2. A drain electrode of the second pull-up transistor Tu2 may be electrically connected to the fourth node n4.

A second pull-down transistor Td2 may be disposed between the fourth node n4 and the second voltage node Vn2. The second pull-down transistor Td2 may include an NMOS transistor. The fourth node n4 may be electrically connected to a drain electrode of the second pull-down transistor Td2. A source electrode of the second pull-down transistor Td2 may be electrically connected to the second voltage node Vn2.

A gate electrode of the second pull-up transistor Tu2 may be electrically connected to a gate electrode of the second pull-down transistor Td2. Both the gate electrode of the second pull-up transistor Tu2 and the gate electrode of the second pull-down transistor Td2 may be electrically connected to the second node (n2).

According to the present general inventive concept, the programmable circuit 10 may include a differential amplifier circuit. Specifically, the first path P1 including the first voltage node Vn1, the first node n1, the first pull-up transistor Tu1, the second node n2, the first pull-down transistor Td1, and the second voltage node Vn2, which are electrically connected to one another, the second path P2 including the first voltage node Vn1, the third node n3, the second pull-up transistor Tu2, the fourth node n4, the second pull-down transistor Td2, and the second voltage node Vn2, which are electrically connected to one another, the gate electrode of the first pull-up transistor Tu1, the gate electrode of the first pull-down transistor Td1, and the fourth node n4, which are electrically connected to one another, and the gate electrode of the second pull-up transistor Tu2, the gate electrode of the second pull-down transistor Td2, and the second node n1, which are electrically connected to one another, may constitute the differential amplifier circuit. In other words, the programmable circuit 10 may include the differential amplifier circuit, which includes the first common voltage node Vn1 and the second common voltage node Vn2. The differential amplifier circuit may include the first pull-up transistor Tu1 and the second pull-up transistor Tu2 connected in parallel between the first and second common voltage nodes Vn1 and Vn2. Accordingly, the programmable circuit 10 may include the first programmable element Tp1 electrically connected between the first common voltage node Vn1 of the differential amplifier circuit and the first pull-up transistor Tu1 and the second programmable element Tp2 electrically connected between the first common voltage node Vn1 and the second pull-up transistor Tu2.

Alternatively, when it is assumed that a first pull-up node nu1 is interposed between the first voltage node Vn1 of the differential amplifier circuit and the first pull-up transistor Tu1 and a second pull-up node nu2 is interposed between the first voltage node Vn1 and the second pull-up transistor Tu2, the programmable circuit 10 may include the differential amplifier circuit. Also, the programmable circuit 10 may include the first programmable element Tp1 electrically connected to the first pull-up node nu1 of the differential amplifier circuit and the second programmable element Tp2 electrically connected to the second pull-up node nu2 thereof.

The programmable circuit 10 may include first and second input switching elements, which may be used to input respective input signals to program the programmable circuit 10 as discussed further below. For example, the programmable circuit 10 may include a first input transistor Ti1 and a second input transistor Ti2. A drain electrode of the first input transistor Ti1 may be electrically connected to the third node n3. A drain electrode of the second input transistor Ti2 may be electrically connected to the first node n1. Various voltages may be applied to gate electrodes of the first and second input transistors Ti1 and Ti2. For example, different voltages may be applied to the gate electrodes of the first and second input transistors Ti1 and Ti2. Also, various voltages may be applied to source electrodes of the first and second input transistors Ti1 and Ti2. For example, different voltages may be applied to the source electrodes of the first and second input transistors Ti1 and Ti2.

The programmable circuit 10 may include an output transistor (To) that outputs an output signal in response to being activated. In at least one exemplary embodiment, the output signal is the signal realized by the fourth node n4. In at least one exemplary embodiment a source electrode of the output transistor To may be electrically connected to the fourth node n4. An output node Vout and/or a complementary output node Vout_B may be connected in parallel to a drain electrode of the output transistor To. The complementary output node Vout_B may include an inverter INV. When the output transistor To is omitted and a process of programming the programmable circuit 10 or an operation of the programmable circuit 10 is not required, unnecessary output signals may be transmitted to other circuits, causing malfunctions. Accordingly, the output transistor To may prevent transmission of an output value of the programmable circuit 10 to other circuits. In applied exemplary embodiments, when an initial output value of the programmable circuit 10 is set at a constant value or when an output value of the programmable circuit 10 hardly affects other circuits, the output transistor To may be omitted.

In applied exemplary embodiments, the output transistor To may include a PMOS transistor. When the output transistor To is the PMOS transistor, since an output value of the programmable circuit 10 is externally transmitted without an additional signal, little to no power may be consumed during a circuit operation.

In the present general inventive concept, each of the programmable elements Tp1 and Tp2 may include an ultrathin gate insulating layer.

The gate insulating layer may be formed to a thickness of about several tens of angstroms (Å). In exemplary embodiments of the present general inventive concept, experiments were conducted under the assumption that a gate insulating layer had a thickness of about 30 to 40 Å, a program voltage was set to about 7 V or higher, each of an supply voltage and a turn-on voltage was set to about 3 V or higher, and a ground voltage was set to 0 V. In the present general inventive concept, since the thickness of the gate insulating layer, the program voltage, and the supply voltage are closely associated with one another, there is no need to present specific numerical values. Accordingly, designs and experimental conditions presented in the current specification are only exemplarily set to show that the present general inventive concept may be fully realized.

Figure 2:
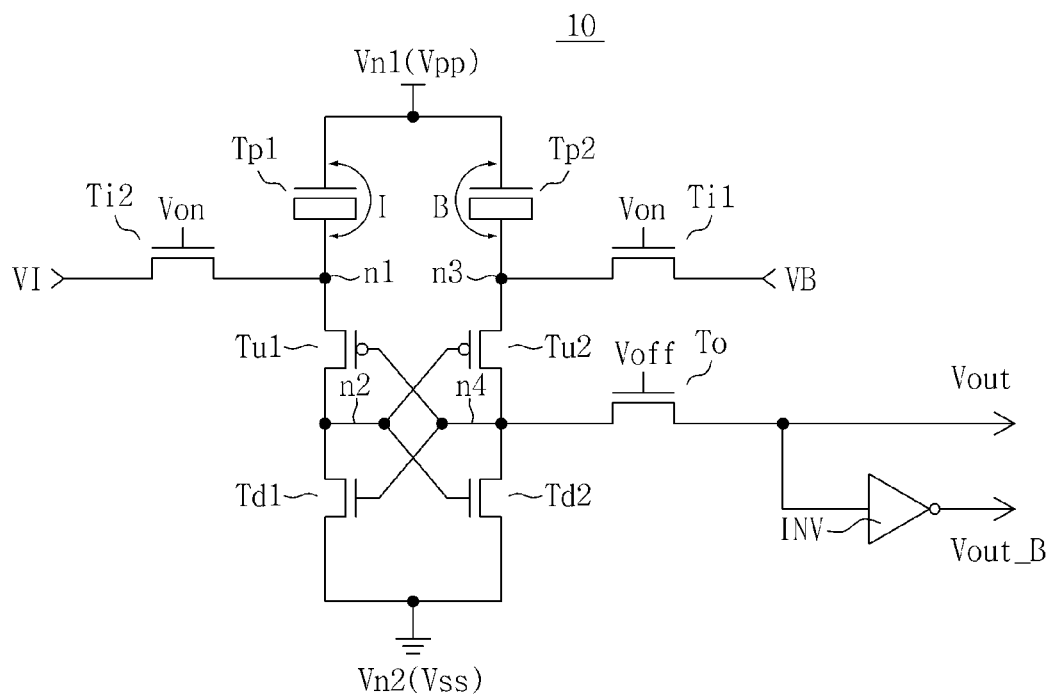
FIG. 2 is a circuit diagram illustrating a method of programming the programmable circuit shown in FIG. 1.

FIG. 2 is a circuit diagram illustrating a method of programming the programmable circuit shown in FIG. 1.

Referring to FIG. 2, a program voltage Vpp may be applied to the first voltage node Vn1, a reference voltage Vss may be applied to the second voltage node Vn2, a turn-on voltage Von may be applied to the gate electrodes of the first and second input transistors Ti1 and Ti2, a breakdown voltage VB may be applied to the source electrode of the first input transistor Ti1, an inhibition voltage VI may be applied to the source electrode of the second input transistor Ti2, and a turn-off voltage Voff may be applied to a gate electrode of the output transistor To. The first and second input transistors Ti1 and Ti2 may be turned on, while the output transistor To may be turned off. In the exemplary embodiments, it is assumed that the reference voltage Vss is a ground voltage Vg (=0). The inhibition voltage VI and the breakdown voltage VB may be appreciated as being examples of input signals received by the second and first transistors Ti2/Ti1, respectively, which may be utilized to program the programmable circuit 10 as discussed further below.

A voltage VI-Vth2, which may be lower than the inhibition voltage VI by a second threshold voltage Vth2 of the second input transistor Ti2, may be applied to the first node n1, while a voltage VB-Vth1, which may be lower than the breakdown voltage VB by a first threshold voltage Vth1 of the first input transistor Ti1, may be applied to the third node n3. However, when the threshold voltage VB is lower than the first threshold voltage Vth1, for example, when a ground voltage Vg is applied, the ground voltage Vg or the first threshold voltage Vth1 may be applied to the third node n3. In this case, the first threshold voltage Vth1 of the first input transistor Ti1 may be a negligibly low voltage. Also, the first threshold voltage Vth1 may be controlled to be a negligibly low voltage due to an ion implantation process during fabrication of the first input transistor Ti1. Similarly, the second threshold voltage Vth2 of the second input transistor Ti2 may be controlled to be a negligibly low voltage. The negligibly low voltage may be interpreted as a voltage of lower than 0.67 V, which may correspond to a bandgap of silicon (Si). When a germanium (Ge) transistor is used instead of a Si transistor, the negligibly low voltage may be interpreted as a voltage of lower than 0.3 V, which may correspond to a Ge bandgap.

Assuming that the first and second input transistors Ti1 and Ti2 and the first and second pull-up transistors Tu1 and Tu2 all have the same threshold voltage Vth, a voltage VI-2Vth, which is lower than the voltage of the first node n1 by the threshold voltage Vth of the first pull-up transistor Tu1, may be applied to the second node n2. Since the voltage of the third node n3 cannot exceed the threshold voltage Vth of the second pull-up transistor Tu2, a voltage of 0 or almost 0 may be applied to the fourth node n4. Hereinafter, it is assumed that transistors have negligible voltage drop effects, if any. Accordingly, even if no additional description is provided, it will be understood that a potential difference between source and drain electrodes of the transistors may be the threshold voltage (±Vth). Accordingly, it may be assumed for brevity that an inhibition voltage VI is applied to the first node n1 and a breakdown voltage VB is applied to the third node n3. For more clarity, a state where a voltage is applied or current flows will be described by a term "logic 'H' state," and a state where a voltage is not applied or no current flows will be described by a term "logic state."

Referring back to FIG. 2, a program voltage Vpp and an inhibition voltage VI may be respectively applied to the gate electrode and bulk of the first programmable element Tp1. In this case, a difference between the program voltage Vpp and the inhibition voltage VI may be maintained to such an extent as not to break down a gate insulating layer, of the first programmable element Tp1. For example, the inhibition voltage VI may be about half the program voltage Vpp.

The program voltage Vpp and a breakdown voltage VB may be respectively applied to the gate electrode and bulk of the second programmable element Tp2. A difference between the program voltage Vpp and the breakdown voltage VB may allow a gate insulating layer, of the second programmable element Tp2 to be broken down and/or destroyed. For example, when the ground voltage Vg is applied as the breakdown voltage VB, the program voltage Vpp may be higher than a lowest voltage by which the gate insulating layer may be broken down. That is, the voltage difference across the second programmable transistor TP2 may exceed a breakdown voltage threshold of the second programmable element TP2. Accordingly, the gate insulating layer of the second programmable transistor Tp2 may be broken down and/or destroyed so that the second programmable transistor Tp2 may be changed into a resistive element. In this case, no change may be made to the first programmable transistor Tp1.

Since the output transistor To is turned off, the output node Vout and the complementary output node Vout_B may have arbitrary values.

Figure 3:
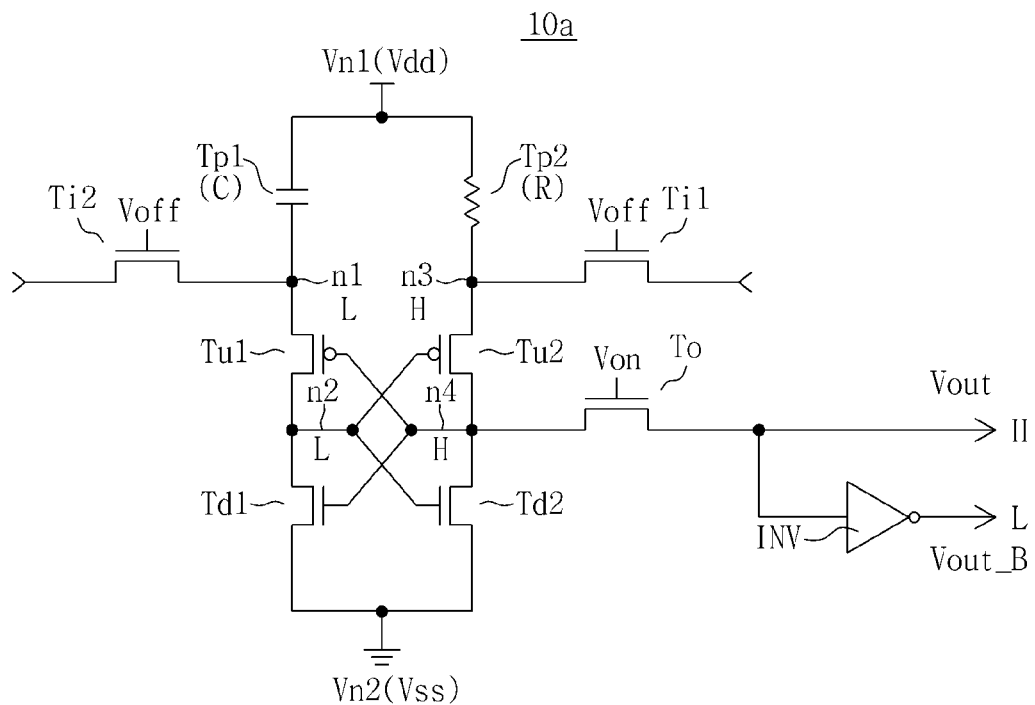
FIG. 3 is a circuit diagram illustrating a circuit operation after the programmable circuit shown in FIG. 1 is programmed in the method shown in FIG. 2.

FIG. 3 is a circuit diagram illustrating a circuit operation after the programmable circuit shown in FIG. 1 is programmed in the method shown in FIG. 2.

Referring to FIG. 3, in the programmed programmable circuit 10a, the first programmable element Tp1 may operate by circuitry as a capacitor C, and may effect a virtual open circuit state, while the second programmable transistor Tp2 may operate by circuitry as a resistive element R, and may effect a virtual short circuit state.

More specifically, a supply voltage Vdd may be applied to the first voltage node Vn1, a ground voltage Vss may be applied to the second voltage node Vn2, a turn-off voltage Voff may be applied to both a gate electrode of the first input transistor Ti1 and a gate electrode of the second input transistor Ti2, and a turn-on voltage Von may be applied to a gate electrode of the output transistor To. The supply voltage Vdd may refer to a relatively high voltage by which elements of the current programmable circuit 10 may operate normally without serious electrical stress. The turn-on voltage Von may not be a specific voltage but rather a voltage by which the corresponding transistor may be turned on, i.e., activated. Accordingly, when the first and second input transistors Ti1/Ti2 are activated, the inputs of the first and second transistors Ti1/Ti2, for example VB and VI, may be realized at the first node n3 and the third node n1, respectively, thus ultimately being realized by the first and second programmable elements Tp1/Tp2, respectively. Similarly, the turn-on voltage Voff may not be a specific voltage but rather a voltage by which the corresponding transistor may be turned off. That is, respective transistors may have different turn-on and turn-off voltages Von and Voff. Therefore, it may be understood that the turn-on and turn-off voltages Von and Voff described in the specification are only functional names but do not refer to specific voltages.

When the supply voltage Vdd is applied to the first voltage node Vn1, the first node n1 may be transitioned to a logic "L" state, and the third node n3 may be transitioned to a logic "H" state. Thus, the second node n2 may be transitioned to a relative logic "L" state, and the fourth node may be transitioned to a relative logic "H" state. Due to the relative logic "L" state of the second node n2, the second pull-up transistor Tu2 may be turned on, while the second pull-down transistor Td2 may be turned off. Due to the relative logic "H" state of the fourth node n4, the first pull-up transistor Tu1 may be turned off, while the first pull-down transistor Td1 may be turned on. As a result of the above-described differential amplification operation, the third node n3 may be transitioned to a reliable logic "L" state, while the fourth node n4 may be transitioned to a reliable logic "H" state.

After the fourth node n4 is transitioned to the reliable logic "H" state, when the output transistor To is turned on, current may flow so that an output node Vout may output a logic "H" value, and a complementary output node Vout_B may output a logic "L" value. An inverter INV may be disposed at the complementary output node Vout_B to compensate for a threshold voltage drop effect. The programmed programmable circuit 10a may always have constant output values H/L.

Figure 4:
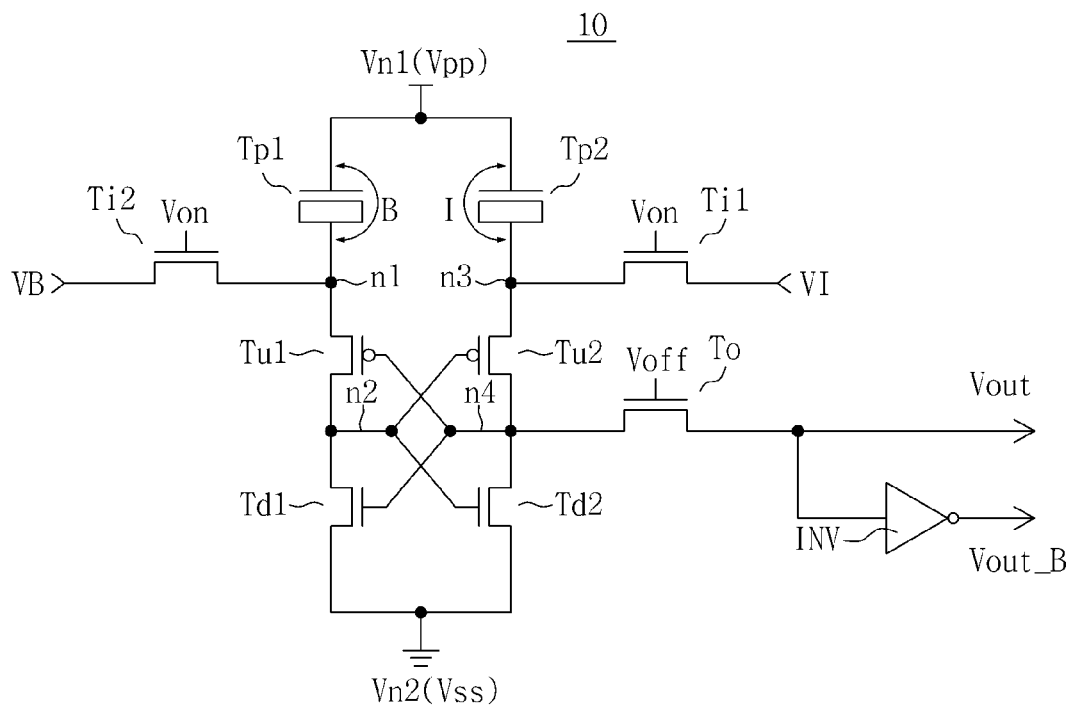
FIG. 4 is a circuit diagram illustrating a method of programming the programmable circuit shown in FIG. 1, according to other exemplary embodiments of the present general inventive concept.

FIG. 4 is a circuit diagram illustrating a method of programming the programmable circuit shown in FIG. 1, according to other exemplary embodiments of the present general inventive concept.

Referring to FIG. 4, as compared with the method shown in FIG. 2, a program voltage Vpp may be applied to the first voltage node Vn1, a reference voltage Vss may be applied to the second voltage node Vn2, a turn-on voltage Von may be applied to the gate electrodes of the first and second input transistors Ti1 and Ti2, an inhibition voltage VI may be applied to the source electrode of the first input transistor Ti1, a breakdown voltage VB may be applied to the source electrode of the second input transistor Ti2, and a turn-off voltage Voff may be applied to the gate electrode of the output transistor To. The first and second input transistors Ti1 and Ti2 may be turned on, while the output transistor To may be turned off. In the exemplary embodiments, it is assumed that the reference voltage Vss is a ground voltage Vg (i.e., 0V).

The breakdown voltage VB may be applied to the first node n1, while the inhibition voltage VI may be applied to the third node n3. In other words, the method of programming the circuit illustrated in FIG. 4 may mirror the method of programming the circuit illustrated in FIG. 2 based on the manipulation of the first and second input switching element, i.e., the first and second input transistors Ti1/Ti2.

More specifically, instead of applying the inhibition voltage VI to the first programmable element Tp1 (see of FIG. 2), the program voltage Vpp and the breakdown voltage VB may be respectively applied to the gate electrode and bulk of the first programmable element Tp1. Similarly, the program voltage Vpp and the inhibition voltage VI may be respectively applied to the gate electrode and bulk of the second programmable transistor Tp2. As mentioned above, the first and second input transistors Ti1/Ti2 may input the inhibition voltage VI and the breakdown voltage VB to the respective programmable elements Tp1/Tp2. Accordingly, a gate insulating layer of the second programmable transistor Tp2 may be broken down and/or destroyed so that the second programmable transistor Tp2 may be changed into a resistive element. In this case, no change may be made to the first programmable element Tp1. Also, since the output transistor To is turned off, the output node Vout and the complementary output node Vout_B may have arbitrary values. Other matters that are not specifically described may be understood in further detail with reference to FIG. 2.

Figure 5:
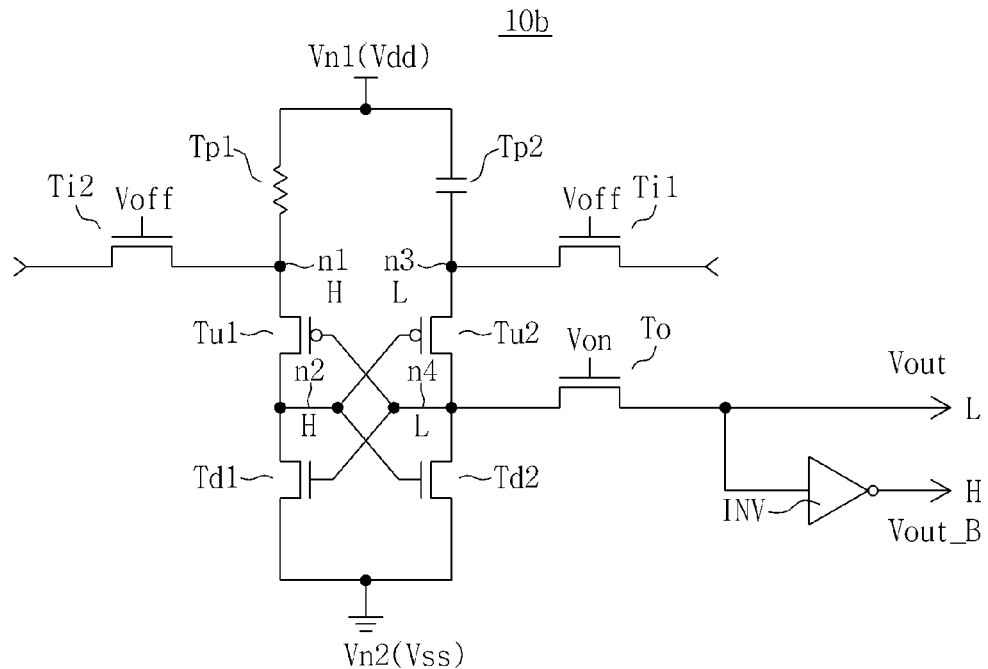
FIG. 5 is a circuit diagram illustrating a circuit operation after the programmable circuit shown in FIG. 1 is programmed in the method shown in FIG. 4.

FIG. 5 is a circuit diagram illustrating a circuit operation after the programmable circuit illustrated in FIG. 1 is programmed in the method shown in FIG. 4. Accordingly, since the programming method of FIG. 4 mirrors the programming method illustrated in FIG. 2, the circuit illustrated in FIG. 5 mirrors the circuit illustrated in FIG. 3, as discussed below.

Referring to FIG. 5, in the programmed programmable circuit 10b, the first programmable element Tp1 may operate by circuitry as a resistive element R or in a short state, while the second programmable transistor Tp2 may operate by circuitry as a capacitor C or in an open state. More specifically, an supply voltage Vdd may be applied to the first voltage node Vn1, a ground voltage Vss may be applied to the second voltage node Vn2, a turn-off voltage Voff may be applied to both a gate electrode of the first input transistor Ti1 and a gate electrode of the second input transistor Ti2, and a turn-on voltage Von may be applied to a gate electrode of the output transistor To.

When the supply voltage Vdd is applied to the first voltage node Vn1, the first node n1 may be transitioned to a logic "H" state, and the third node n3 may be transitioned to a logic "L" state. Thus, the second node n2 may be transitioned to a relative logic "H" state, and the fourth node n4 may be transitioned to a relative logic "L" state. Due to the relative logic "H" state of the second node n2, the second pull-up transistor Tu2 may be turned off, while the second pull-down transistor Td2 may be turned on. Due to the relative logic "L" state of the fourth node n4, the first pull-up transistor Tu1 may be turned on, while the first pull-down transistor Td1 may be turned off. As a result of the above-described differential amplification operation, the third node n3 may be transitioned to a reliable logic "H" state, and the fourth node n4 may be transitioned to a reliable logic "L" state.

After the fourth node n4 is transitioned to a reliable logic "L" state, when the output transistor To is turned on, current may flow so that the output node Vout may output a logic "L" value and the complementary output node Vout_B may output a logic "H" value. The programmed programmable circuit 10b may always have constant output values L/H.

Other matters that are not specifically described may be understood in further detail with reference to FIG. 3.

FIGS. 6A through 6G are circuit diagrams of programmable circuits according to other exemplary embodiments of the present general inventive concept. Initial values of unprogrammed programmable circuits may be previously set.

Figure 6A:
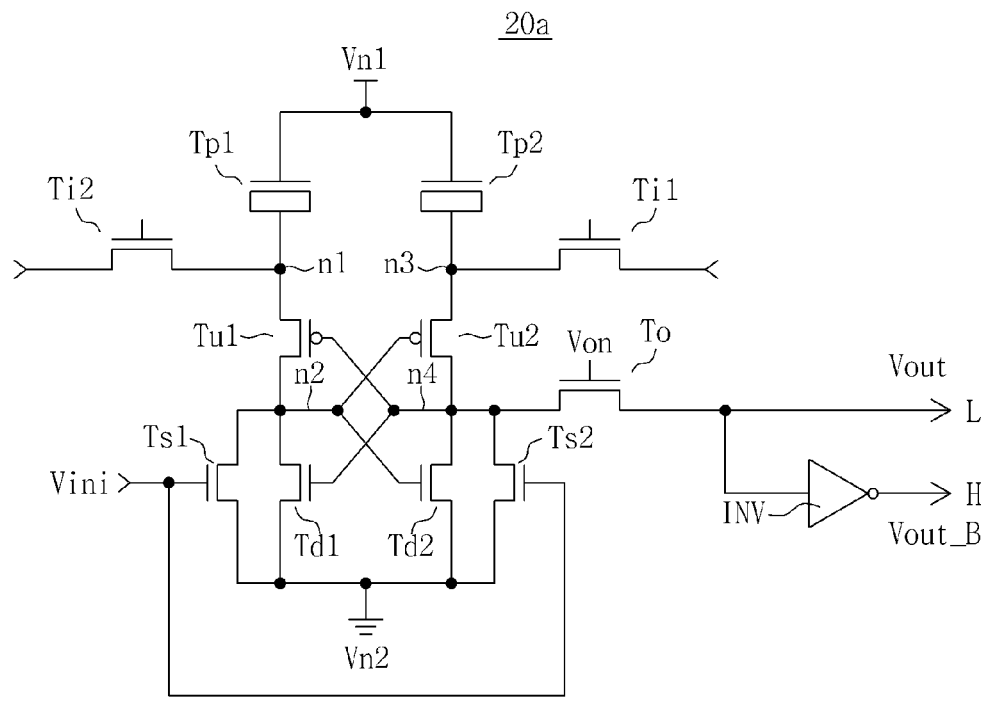
FIGS. 6A through 6G are circuit diagrams of programmable circuits according to other exemplary embodiments of the present general inventive concept.

Referring to FIG. 6A, as compared with the programmable circuit 10 shown in FIG. 1, a programmable circuit 20a according to other exemplary embodiments of the present general inventive concept may include one or more setting transistors to set initial values of the programmable circuit. That is, the setting transistor may initially set the nodes. In at least one exemplary embodiment illustrated in FIG. 6C, the programmable circuit 20c includes a first setting transistor Ts1 and a second setting transistor Ts2 configured to set initial values. A drain electrode of the first setting transistor Ts1 may be electrically connected to a second node n2, and a source electrode of the first setting transistor Ts1 may be electrically connected to the second voltage node Vn2. A drain electrode of the second setting transistor Ts2 may be electrically connected to the fourth node n4, and a source electrode of the second setting transistor Ts2 may be electrically connected to the second voltage node Vn2. A gate electrode of the first setting transistor Ts1 may be electrically connected to a gate electrode of the second setting transistor Ts2. That is, the first and second setting transistors Ts1 and Ts2 may be simultaneously turned on or off. A ground voltage Vg may be applied to the second voltage node Vn2.

During an initial operation, a setting voltage Vini may be applied to the gate electrodes of the first and second setting transistors Ts1 and Ts2. When the first and second setting transistors Ts1 and Ts2 are turned on in response to the setting voltage Vini, the second and fourth nodes n2 and n4 may be transitioned to a logic "L" state irrespective of operations of other transistors. Accordingly, when an output transistor To is turned on, an output node Vout may be unconditionally in a logic "L" state, and a complementary output node Vout_B may be unconditionally in a logic "H" state. When an initial output value of the unprogrammed programmable circuit 20a is intended to be fixed at a logic "H" value or logic "L" value, the present general inventive concept may be applied. In the embodiment, an initial output value of the programmable circuit 20a may be a logic "L" value, and a complementary initial output value thereof may be a logic "H" value.

The setting voltage Vini may be applied by a mode register set (MRS). A programing process may be understood with reference to FIGS. 2 and 4. During and after the programming process, the first and second setting transistors Ts1 and Ts2 may remain turned off.

Figure 6B:
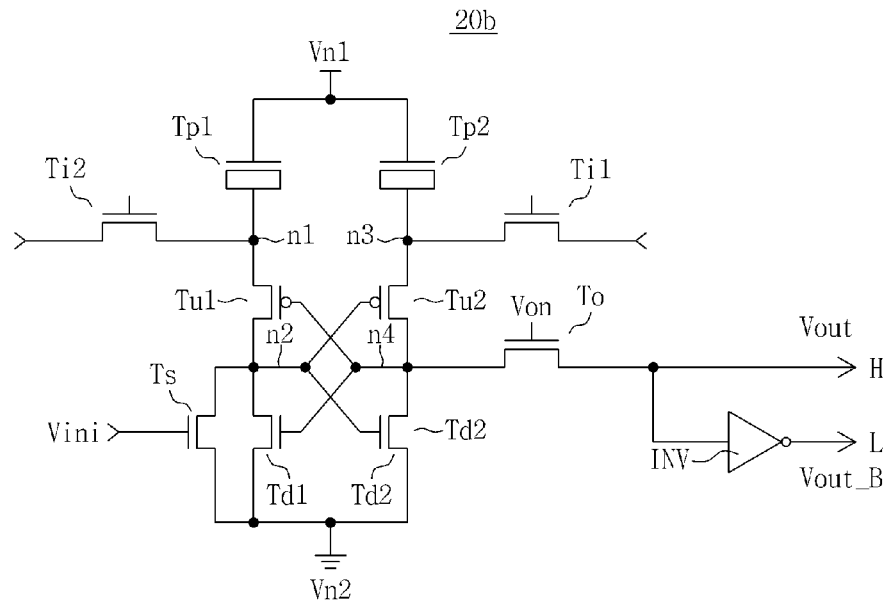

Referring to FIG. 6B, as compared with the programmable circuit 10 shown in FIGS. 1 and 6A, a programmable circuit 20b according to other exemplary embodiments of the present general inventive concept may include a single setting transistor Ts configured to set an initial value, as opposed to first and second setting transistors. A source electrode of the setting transistor Ts may be electrically connected to a second node n2, and a drain electrode of the setting transistor Ts may be electrically connected to a second voltage node Vn2. A ground voltage may be applied to the second voltage node Vn2. During an initial operation, a setting voltage Vini may be applied to a gate electrode of the setting transistor Ts. When the setting transistor Ts is turned on in response to a setting voltage Vini, the second node n2 may be transitioned to a logic "L" state irrespective of operations of other transistors. When the second node n2 is transitioned to the logic "L" state, a fourth node n4 may be transitioned to a logic "H" state. Thus, when an output transistor To is turned on, an output node Vout may be unconditionally in a logic "H" state, and a complementary output node Vout_B may be unconditionally in a logic "L" state. An initial output value of the unprogrammed programmable circuit 20b may be fixed at any one of a logic "H" value and a logic "L" value. In particular, the initial output value may be a logic "H" value, and a complementary initial output value may be a logic "L" value.

Figure 6C:
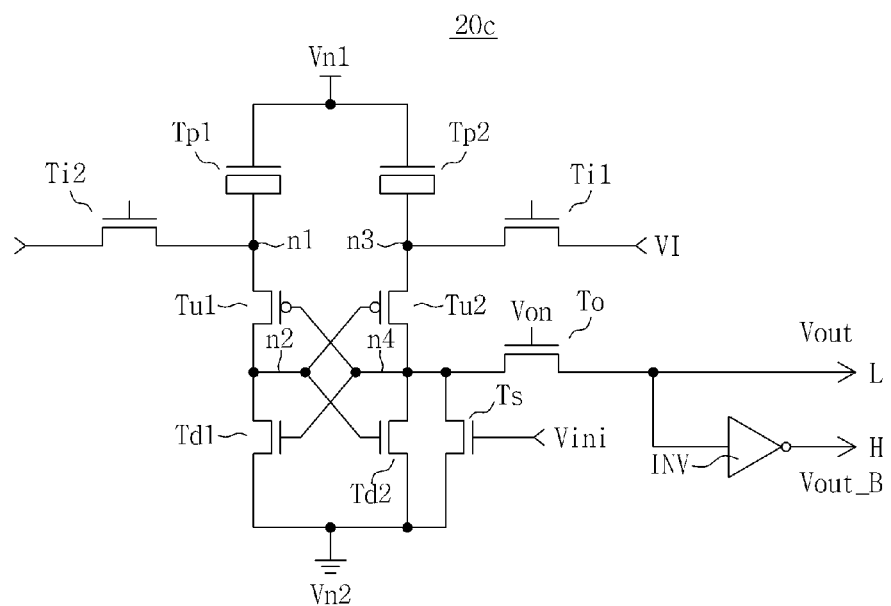

Referring to FIG. 6C, as compared with the programmable circuit 10 shown in FIGS. 1 and 6A, a programmable circuit 20c according to other exemplary embodiments of the present general inventive concept may include a single setting transistor Ts configured to set an initial value. The single setting transistor Ts of FIG. 6C may be connected differently than the single setting transistor Ts of FIG. 6B. More specifically, a source electrode of the setting transistor Ts may be electrically connected to a fourth node n4, and a drain electrode of the setting transistor Ts may be electrically connected to a second voltage node Vn2. A ground voltage may be applied to the second voltage node Vn2. During an initial operation, a setting voltage Vini may be applied to a gate electrode of the setting transistor Ts. When the setting transistor Ts is turned on in response to the setting voltage Vini, a fourth node n4 may be transitioned to a logic "L" state irrespective of operations of other transistors. Accordingly, when an output transistor To is turned on, an output node Vout may be unconditionally in a logic "L" state, and a complementary output node Vout_B may be unconditionally in a logic "H" state. An initial output value of the unprogrammed programmable circuit 20c may be fixed at any one of a logic "H" value and a logic "L" value. In particular, the initial output value may be a logic "L" value, and a complementary initial output value may be a logic "H" value.

Figure 6D:
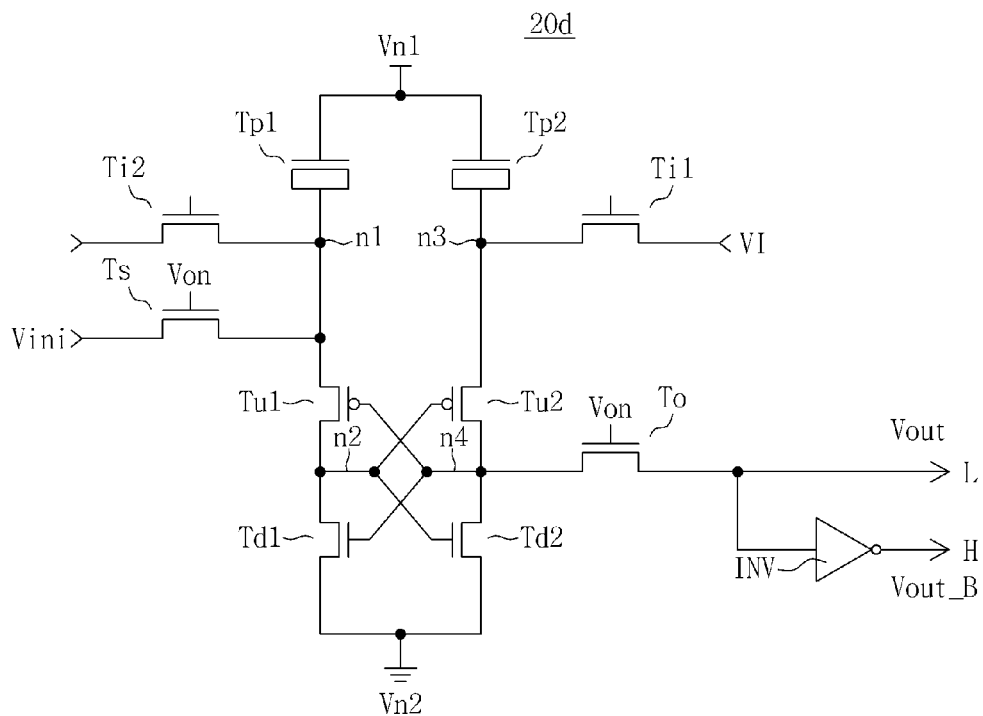

Referring to FIG. 6D, as compared with the programmable circuit 10 shown in FIG. 1, a programmable circuit 20d according to other exemplary embodiments of the present general inventive concept may include a setting transistor Ts configured to set an initial value. A drain electrode of a setting transistor Ts may be electrically connected to a first node n1. During an initial operation, a turn-on voltage Von may be applied to a gate electrode of the setting transistor Ts, while a setting voltage Vini may be applied to a source electrode of the setting transistor Ts. The setting voltage Vini may be in a logic "H" state. Due to the setting transistor Ts, the first node n1 may be transitioned to a logic "H" state. When the first node n1 is transitioned to a logic "H" state, the second node n2 may be transitioned to a logic "H" state, and the fourth node n4 may be transitioned to a logic "L" state. Accordingly, when an output transistor To is turned on, an output node Vout may be unconditionally in a logic "L" state, and a complementary output node Vout_B may be unconditionally in a logic "H" state. An initial output value of the unprogrammed programmable circuit 20d may be fixed at any one of a logic "H" value and a logic "L" value. In particular, the initial output value may be a logic "L" value, and a complementary initial output value may be a logic "H" value.

Figure 6E:
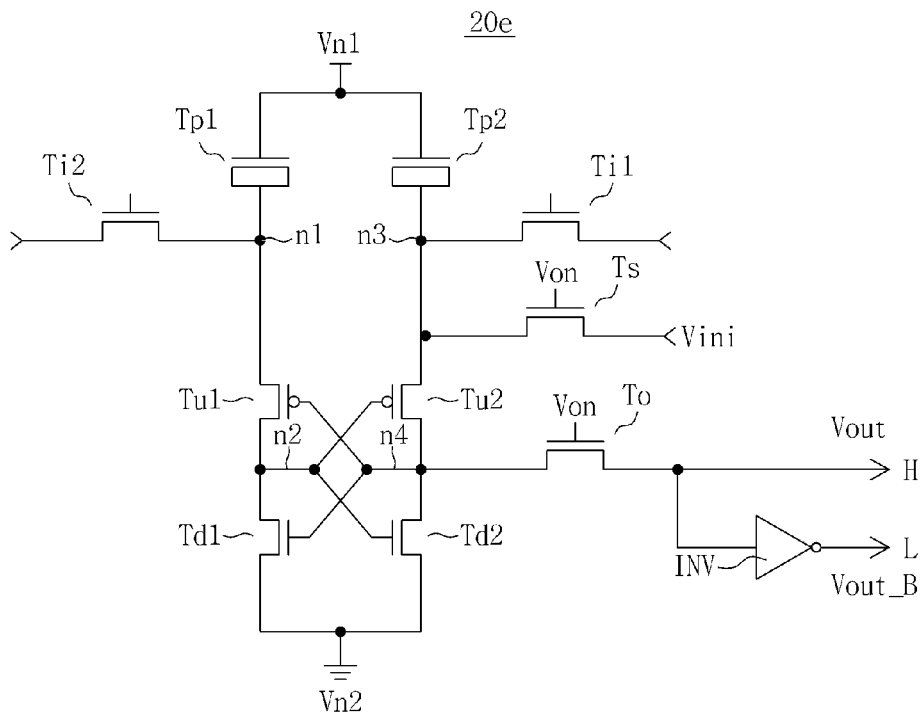

Referring to FIG. 6E, as compared with the programmable circuit 10 shown in FIG. 1, a programmable circuit 20e according to other exemplary embodiments of the present general inventive concept may include a setting transistor Ts configured to set an initial value. A drain electrode of the setting transistor Ts may be electrically connected to a second node n2. During an initial operation, a turn-on voltage Von may be applied to a gate electrode of the setting transistor Ts, while a setting voltage Vini may be applied to a source electrode of the setting transistor Ts. The setting voltage Vini may be in a logic "H" state. Due to the setting transistor Ts, a second node n2 may be transitioned to a logic "H" state.

When the second node n2 is transitioned to a logic "H" state, a fourth node n4 may be transitioned to a logic "H" state, and a third node n3 may be transitioned to a logic "L" state. Accordingly, when an output transistor To is turned on, an output node Vout may be unconditionally in a logic "H" state, and a complementary output node Vout_B may be unconditionally in a logic "L" state. An initial output value of the unprogrammed programmable circuit 20e may be fixed at any one of a logic "H" value and a logic "L" value. In particular, the initial output value may be a logic "L" value, and a complementary initial output value may be a logic "H" value.

Figure 6F:
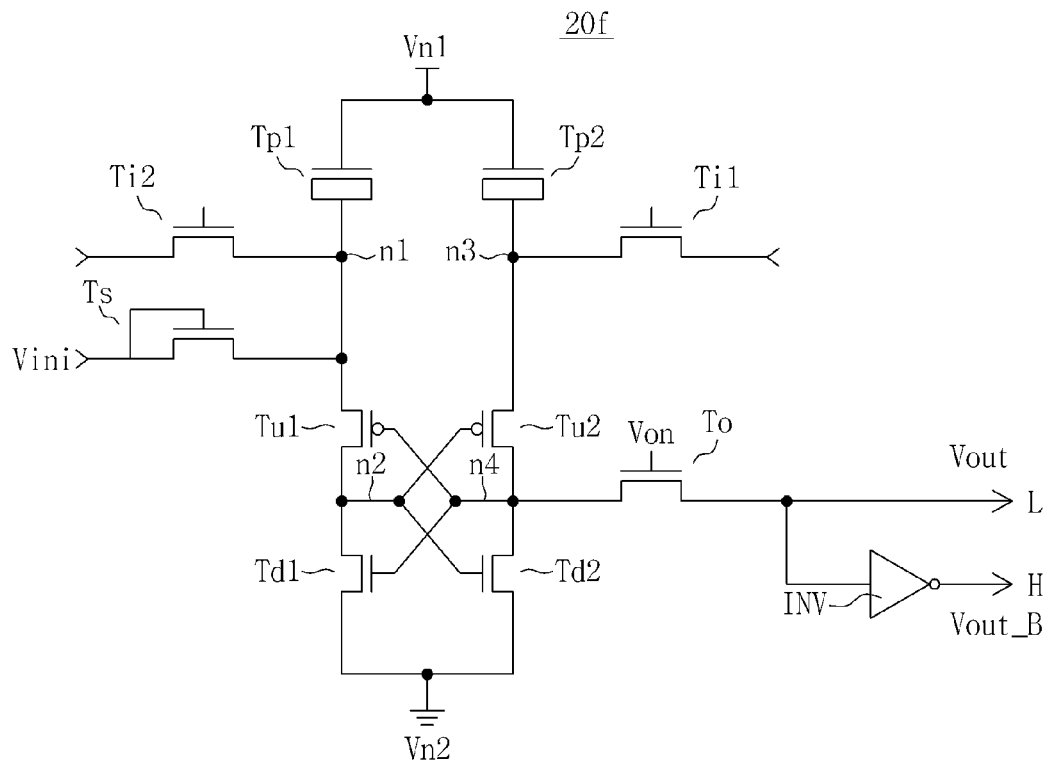

Referring to FIG. 6F, as compared with the programmable circuit 10 shown in FIG. 1, a programmable circuit 20f according to other exemplary embodiments of the present general inventive concept may include a setting transistor Ts configured to set an initial value. A drain electrode of the setting transistor Ts may be electrically connected to a first node n1. Gate and source electrodes of the setting transistor Ts may be electrically connected to each other. That is, the setting transistor Ts may operate as a diode. During an initial operation, a setting voltage Vini may be applied to the source and gate electrodes of the setting transistor Ts. The setting voltage Vini may be in a logic "H" state. Due to the setting transistor Ts, the first node n1 may be transitioned to a logic "H" state. When the first node n1 is transitioned to a logic "H" state, a second node n2 may be transitioned to a logic "H" state, and a fourth node n4 may be transitioned to a logic "L" state. Accordingly, when an output transistor To is turned on, an output node Vout may be unconditionally in a logic "L" state, and a complementary output node Vout_B may be unconditionally in a logic "H" state. An initial output value of the unprogrammed programmable circuit 20f may be fixed at any one of a logic "H" value and a logic "L" value. In particular, the initial output value may be a logic "L" value, and a complementary initial output value may be a logic "H" value.

Figure 6G:
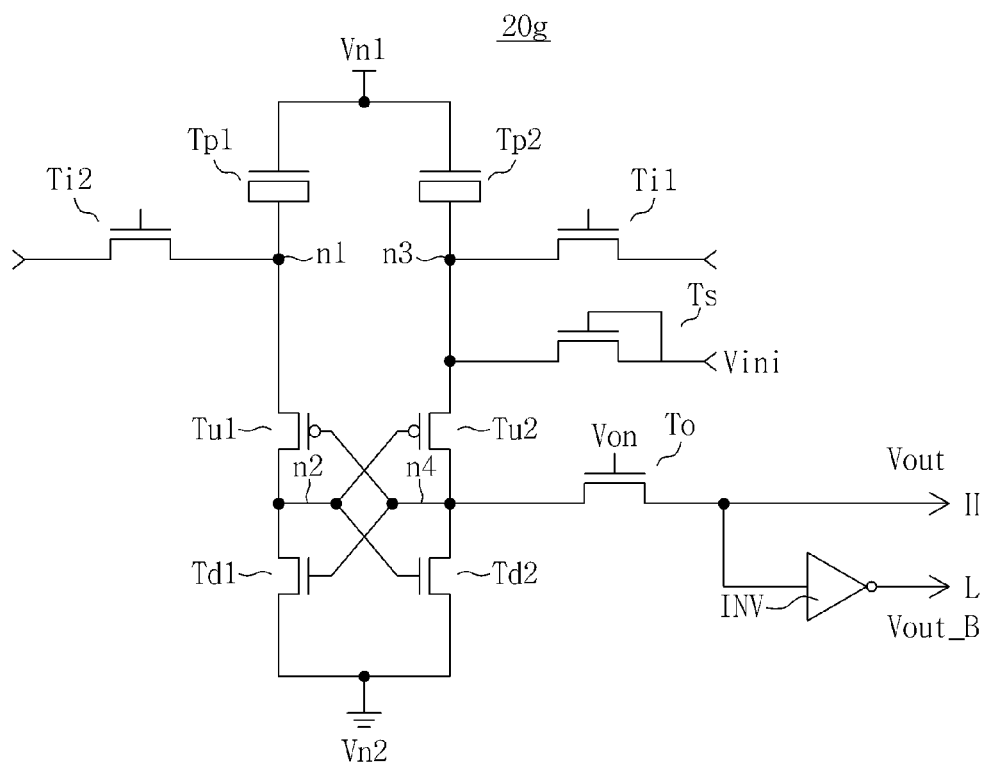

Referring to FIG. 6G, as compared with the programmable circuit 10 shown in FIG. 1, a programmable circuit 20g according to other exemplary embodiments of the present general inventive concept may include a setting transistor Ts configured to set an initial value. A drain electrode of the setting transistor Ts may be electrically connected to a third node n3. Gate and source electrodes of the setting transistor Ts may be electrically connected to each other. That is, the setting transistor Ts may operate as a diode. During an initial operation, a setting voltage Vini may be applied to the source and gate electrodes of the setting transistor Ts. The setting voltage Vini may be in a logic "H" state. Due to the setting transistor Ts, a third node n3 may be transitioned to a logic "H" state. When the third node n3 is transitioned to a logic "H" state, a fourth node n4 may be transitioned to a logic "H" state, and the second node n2 may be transitioned to a logic "L" state. Accordingly, when an output transistor To is turned on, an output node Vout may be unconditionally in a logic "H" state, and a complementary output node Vout_B may be unconditionally in a logic "L" state. An initial output value of the unprogrammed programmable circuit 20g may be fixed at any one of a logic "H" value and a logic "L" value. In particular, the initial output value may be a logic "H" value, and a complementary initial output value may be a logic "L" value.

FIGS. 7A through 7D are circuit diagrams illustrating methods of setting initial values of the programmable circuit shown in FIG. 1, according to other exemplary embodiments of the present general inventive concept. More specifically, setting voltages may be applied to the input switching elements to set the programmable circuit.

Figure 7A:
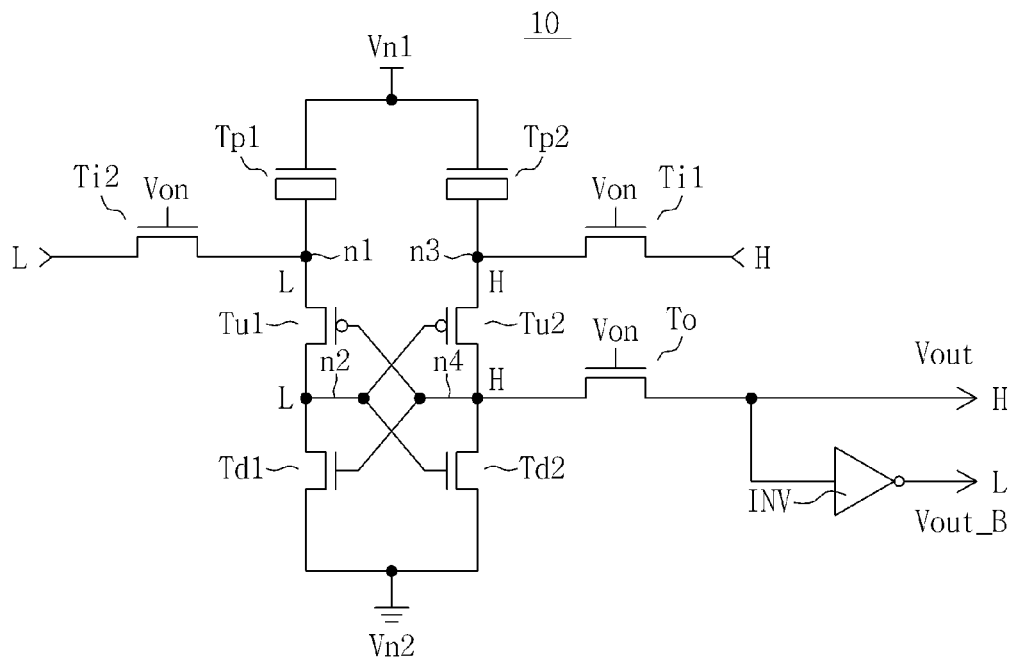
FIGS. 7A through 7D are circuit diagrams illustrating methods of setting initial values of the programmable circuit shown in FIG. 1, according to other exemplary embodiments of the present general inventive concept.

Referring to FIG. 7A, in an initial operation, the first and second input transistors Ti1 and Ti2 may be turned on, a setting voltage Vini or logic "H" voltage may be applied to the source electrode of the first input transistor Ti1, and a ground voltage Vg or logic "L" voltage may be applied to the source electrode of the second input transistor Ti2. In response to the setting voltage Vini or logic "H" voltage, the third and fourth nodes n3 and n4 may be transitioned to a logic "H" state, while the first and second nodes n1 and n2 may be transitioned to a logic "L" state. When the output transistor To is turned on, an initial output value may be in a logic "H" state, and a complementary initial output value may be in a logic "L" state.

Figure 7B:
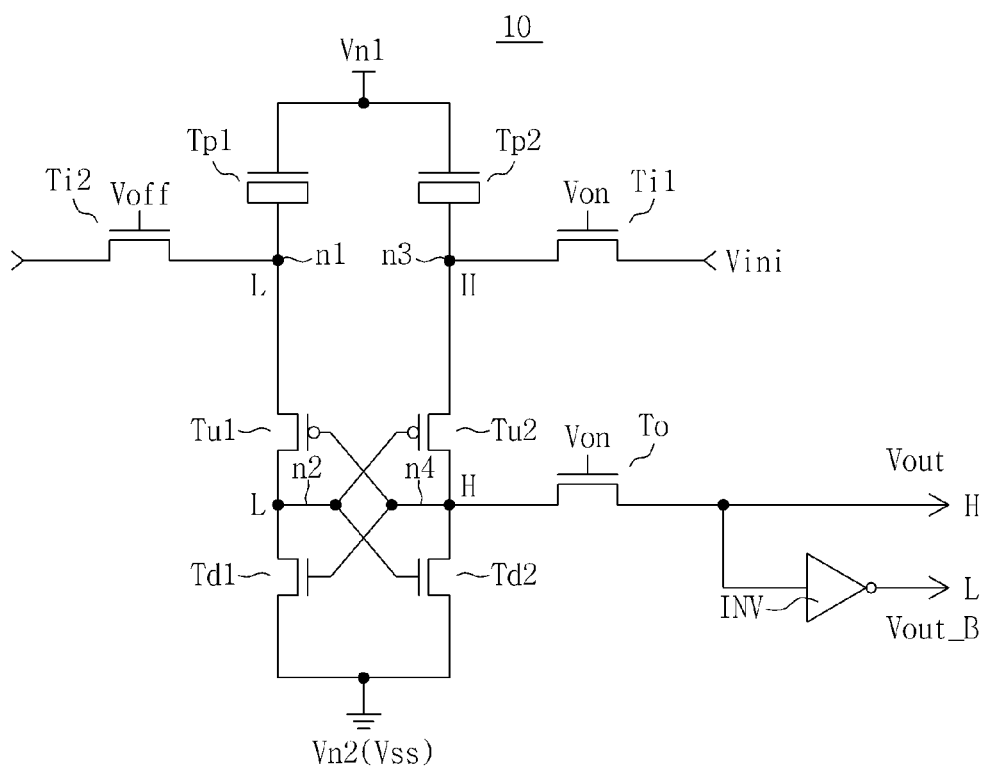

Referring to FIG. 7B, in an initial operation, the first input transistor Ti1 may be turned on, a setting voltage Vini may be applied to the source electrode of the first input transistor Ti1, and the second input transistor Ti2 may be turned off at the same time. Thus, the third and fourth nodes n3 and n4 may be transitioned to a logic "H" state, while the first and second nodes n1 and n2 may be transitioned to a logic "L" state. When an output transistor To is turned on, an initial output value may be in a logic "H" state, and a complementary initial output value may be in a logic "L" state.

Figure 7C:
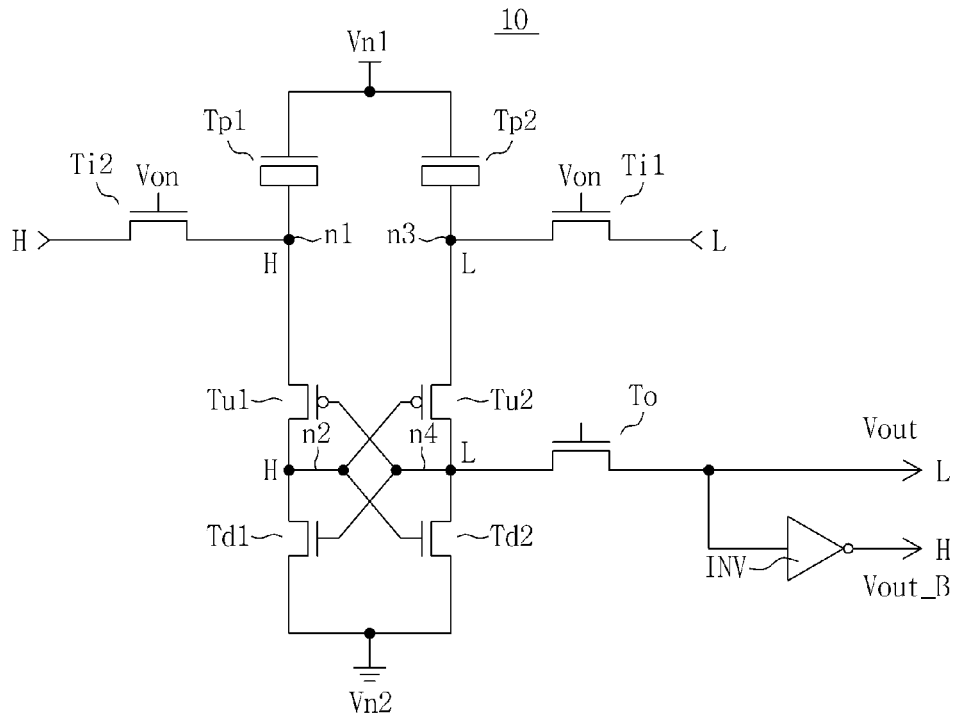

Referring to FIG. 7C, in an initial operation, the first and second input transistors Ti1 and Ti2 may be turned on, a ground voltage Vg or logic "L" voltage may be applied to the source electrode of the first input transistor Ti1, and a setting voltage Vini or logic "H" voltage may be applied to the source electrode of the second input transistor Ti2. The first and second nodes n1 and n2 may be transitioned to a logic "H" in response to the setting voltage Vini or logic "H" voltage, while the third and fourth nodes n3 and n4 may be transitioned to a logic "L" state. When the output transistor To is turned on, an initial output value may be in a logic "L" state, and a complementary initial output value may be in a logic "H" state.

Figure 7D:
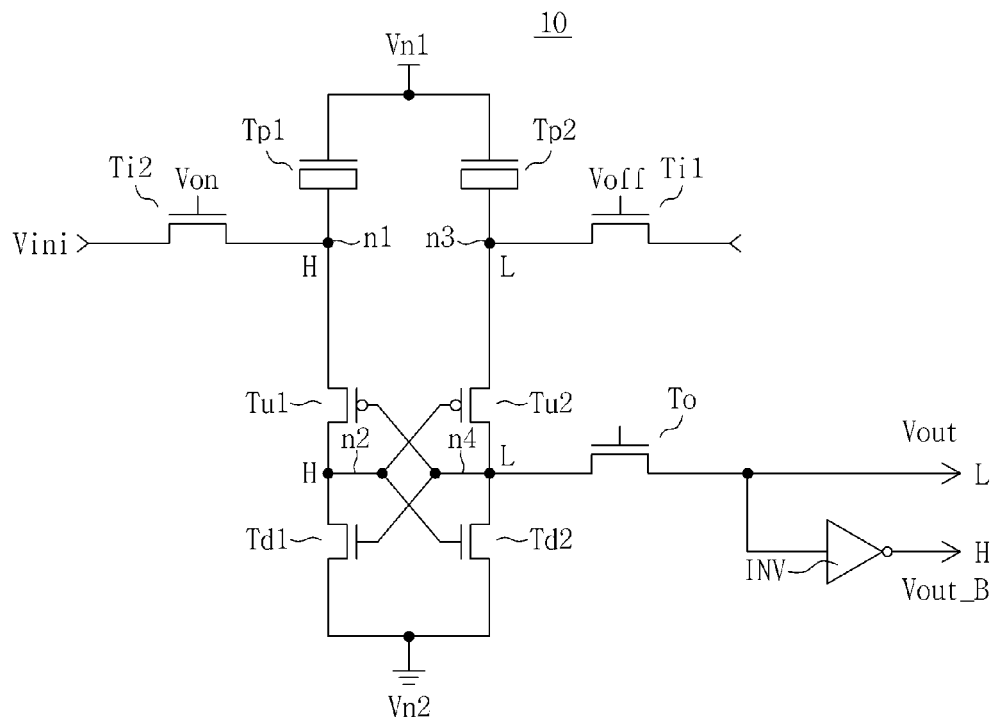

Referring to FIG. 7D, in an initial operation, the first input transistor Ti1 may be turned off and simultaneously, the second input transistor Ti2 may be turned on and a setting voltage Vini may be applied. Thus, the first and second nodes n1 and n2 may be transitioned to a logic "H" state, while the third and fourth nodes n3 and n4 may be transitioned to a logic "L" state. When the output transistor To is turned on, an initial output value may be in a logic "L" state, and a complementary initial output value may be in a logic "H" state.

Figure 8A:
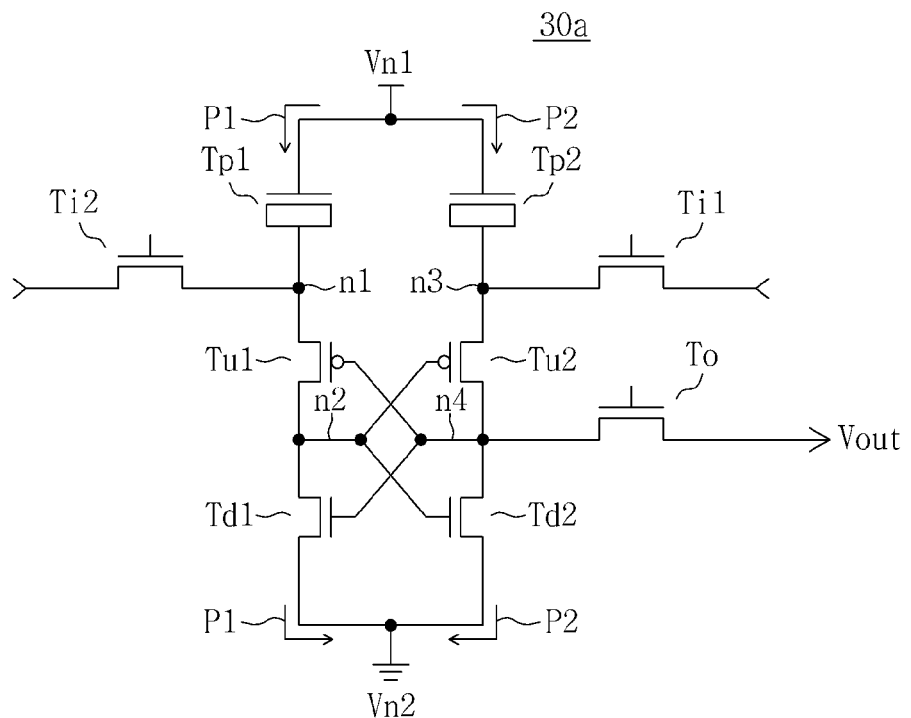
FIGS. 8A through 8C are circuit diagrams of programmable circuits according to other exemplary embodiments of the present general inventive concept.
Figure 8B:
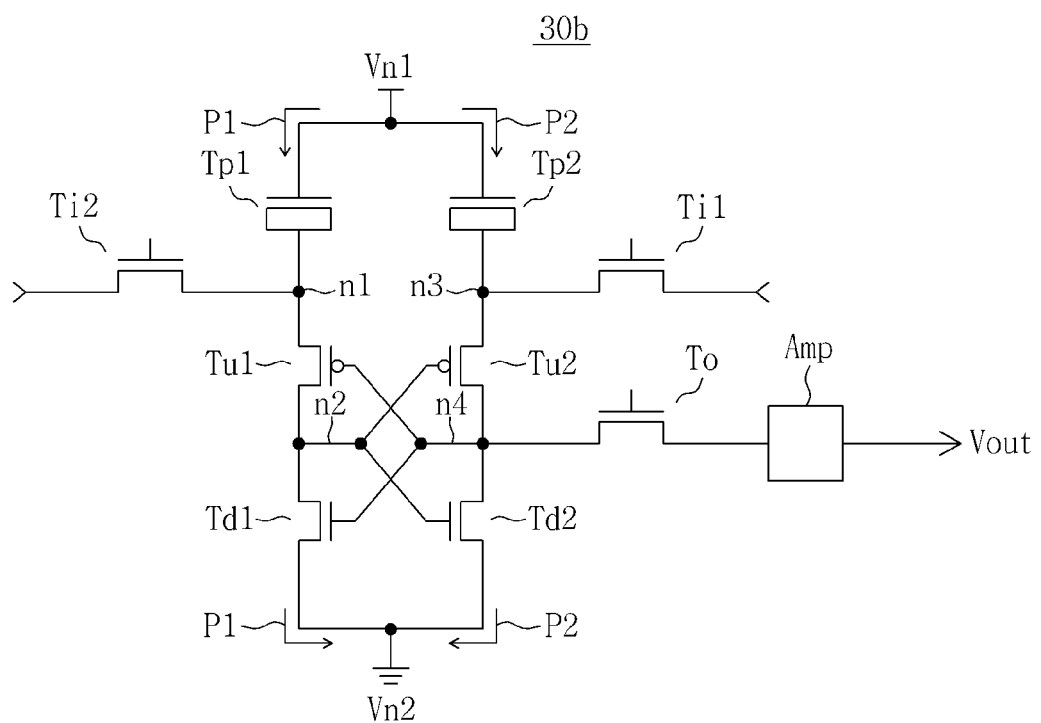
Figure 8C:
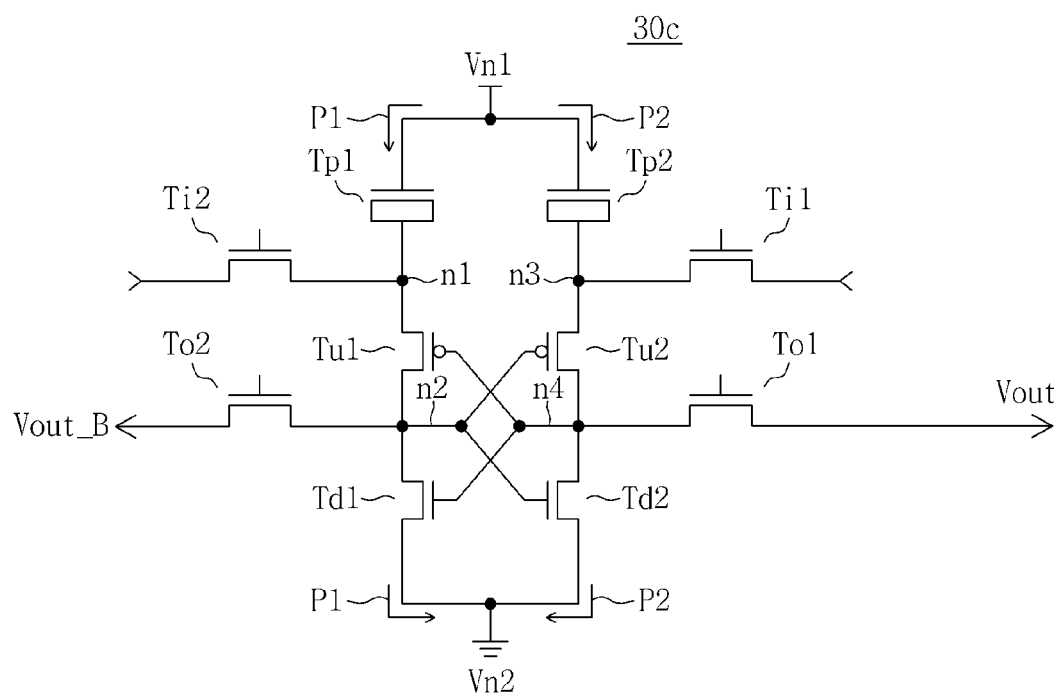

FIGS. 8A through 8C are circuit diagrams of programmable circuits according to other exemplary embodiments of the present general inventive concept. The programmable circuits of FIGS. 8A through 8C will be understood in further detail with reference to the programmable circuit 10 of FIG. 1.

Referring to FIG. 8A, as compared with the programmable circuit 10 of FIG. 1, an inverter INV may be omitted. That is, a programmable circuit 30a may include only one output node Vout. When only one output signal of the programmable circuit 30a is required, the programmable circuit 30a may include only one output node Vout.

Referring to FIG. 8B, as compared with the programmable circuit 30a of FIG. 8A, a programmable circuit 30b may include an amplifier (AMP) in addition to the output node Vout. FIG. 8B exemplarily illustrates that the amplifier AMP may include one or more inverters.

Referring to FIG. 8C, as compared with the programmable circuit 10 of FIG. 1, a programmable circuit 30c may further include a complementary output node Vout_B electrically connected to the second node n2. More specifically, the second node n2 may provide a complementary value that is a complement of the value existing at the fourth node n4. The output node Vout and the complementary output node Vout_B of the programmable circuit 30a may be exchanged. An inverter INV may be omitted from the output node Vout. The programmable circuit 30c may include a first output transistor To1 provided at the output node Vout and a second output transistor To2 provided at the complementary output node Vout_B. Accordingly, a second output transistor To2 may output the complement of the output Vout provided by the first output transistor To1.

It will be understood that the programmable circuits 10, 20a to 20g, and 30a to 30c shown in FIGS. 1 through 8C according to the present general inventive concept may be compatible with one another.

Figure 9:
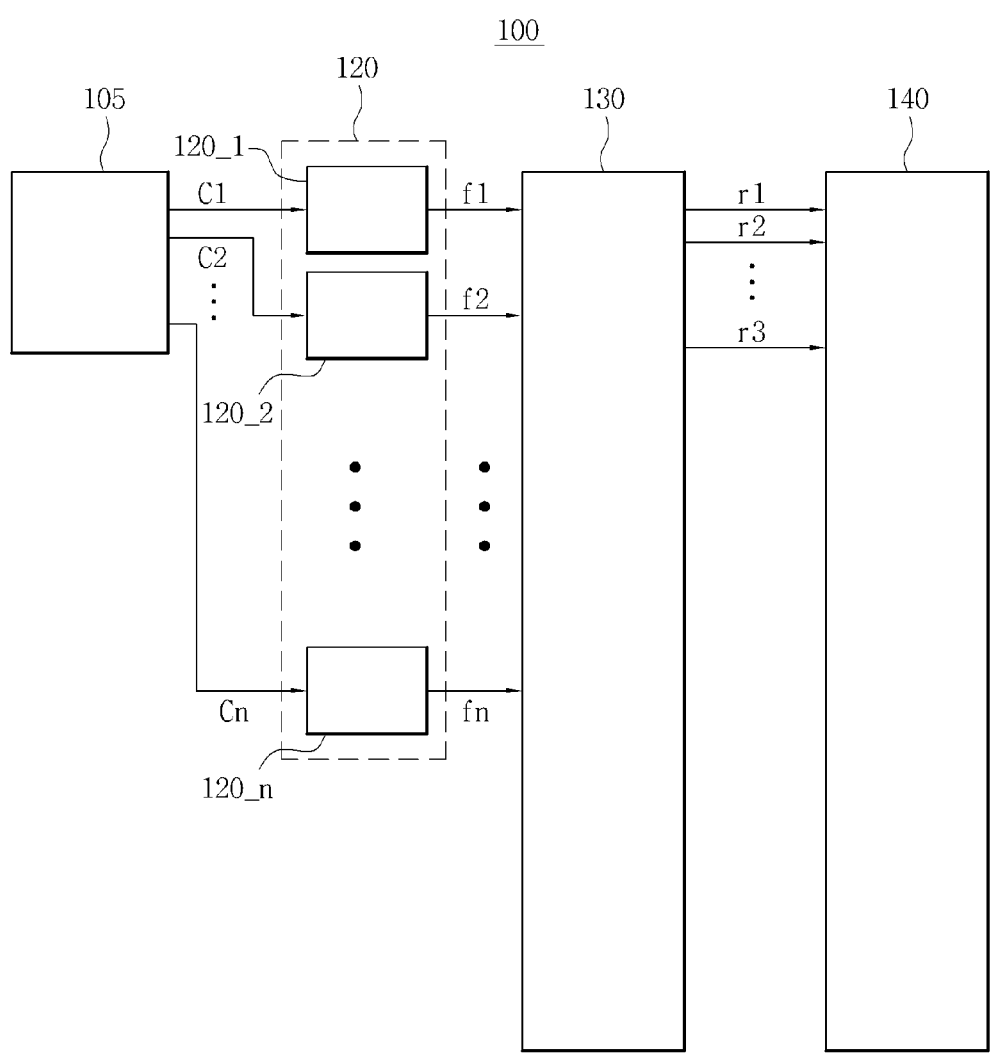
FIG. 9 is a diagram of a semiconductor circuit including programmable circuits according to exemplary embodiments of the present general inventive concept.

FIG. 9 is a diagram of a semiconductor circuit including programmable circuits according to exemplary embodiments of the present general inventive concept. Here, it is exemplarily assumed that programmable circuits according to the exemplary embodiments of the present general inventive concept may be used with a redundancy circuit.

Referring to FIG. 9, a semiconductor circuit 100 may include a program controller 105, a programmable circuit 120, a redundancy circuit 130, and a memory circuit 140. The program controller 105 may include a fuse controller. The programmable circuit 120 may include a plurality of programmable circuits 120-1, 120-2, ..., and 120-n. Each of the plurality of the programmable circuit 120-1, 120-2, ..., and 120-n may include a fuse circuit. The memory circuit 140 may include a plurality of memory cells. The program controller 105 may selectively transmit control command signals C1 to Cn to the programmable circuits 120-x, respectively, based on redundancy information. Each of the programmable circuits 120-1, 120-2, ..., and 120-n may be in a programmed state. The programmable circuits 120-1, 120-2, ..., and 120-n may respectively output constant output signals f1 to fn to a first external circuit 130, for example, the redundancy circuit 130, according to respectively programmed states. The redundancy circuit 130 may output redundancy output signals r1 to rn to a second external circuit 140, for example, the memory circuit 140, in response to the output signals f1 to fn, respectively.

Figure 10:
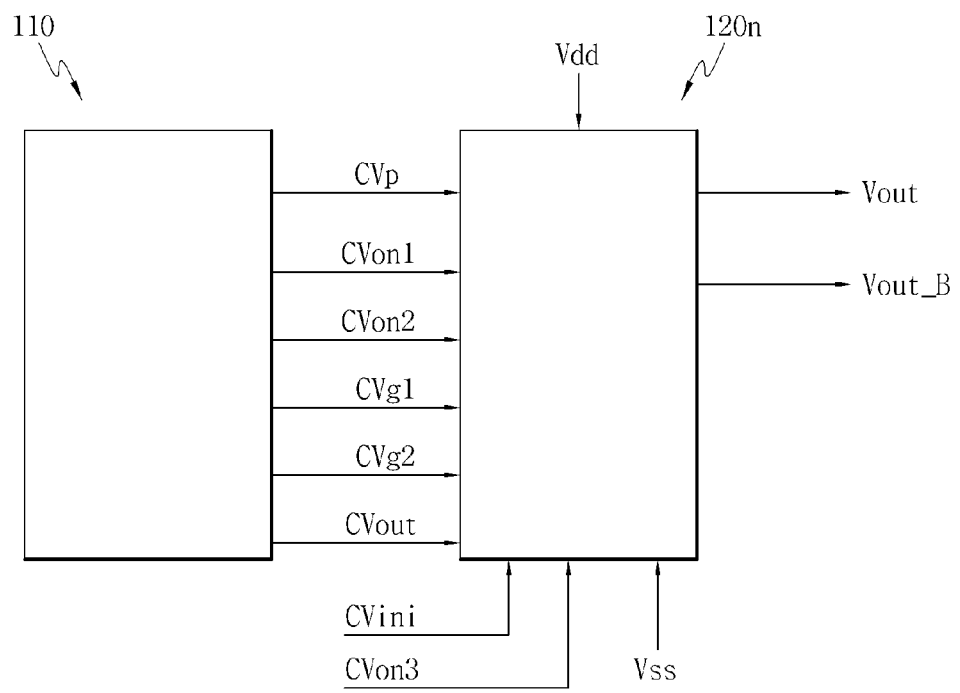
FIG. 10 is a conceptual block diagram illustrating a method of programming a programmable circuit using a programming control circuit.

FIG. 10 is a conceptual block diagram illustrating a process of programming a programmable circuit using a programming control circuit according to exemplary embodiments of the present general inventive concept. Here, it is exemplarily assumed that the programmable circuit 10 shown in FIG. 1 is included.

Referring to FIG. 10, a programming control circuit 110 may transmit a program voltage signal CVp, a first turn-on voltage signal CVon1, a second turn-on voltage signal CVon2, a first program signal CVg1, a second program signal CVg2, and/or an output voltage signal CVout to a programmable circuit 120n. The programmable circuit 120n may receive the program voltage signal CVp, the first turn-on voltage signal CVon1, the second turn-on voltage signal CVon2, the first program signal CVg1, the second program signal CVg2, and/or the output voltage signal CVout and apply the program voltage signal CVp, the first turn-on voltage signal CVon1, the second turn-on voltage signal CVon2, the first program signal CVg1, the second program signal CVg2, and/or the output voltage signal CVout to a first voltage node Vn1, gate and source electrodes of a first input transistor Ti1, gate and source electrodes of a second input transistor Ti2, and/or a gate electrode of an output transistor To, respectively.

The programming control circuit 110 may provide a programming operation, which includes outputting one or more signals to program the programmable circuit 120n. A program operation will be understood with reference to FIGS. 2 and 4. The programmable circuit 120n may receive a supply voltage Vdd and a reference voltage Vss and apply the supply voltage Vdd and the reference voltage Vss to the first voltage node Vn. The programmable circuit 120n may receive a setting voltage signal CVon3 and a setting input signal CVini and apply the setting voltage signal CVon3 and the setting input signal CVini to gate and source electrodes of setting transistors Ts of programmable circuits 20a to 20g of FIGS. 6A through 6G.

Figure 11:
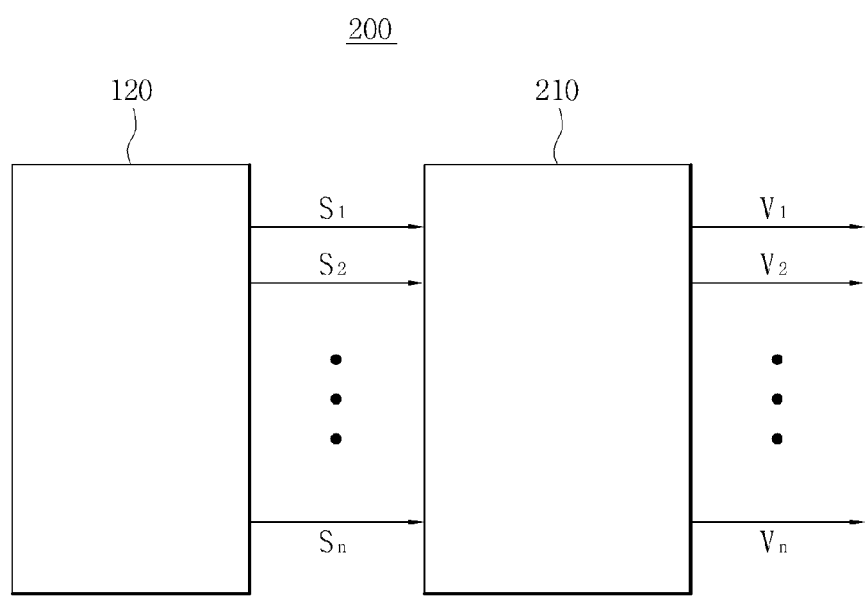
FIG. 11 is a conceptual block diagram of a voltage divider according to exemplary embodiments of the present general inventive concept.

FIG. 11 is a conceptual block diagram of a voltage divider according to exemplary embodiments of the present general inventive concept.

Referring to FIG. 11, a voltage divider 200 may include a programmable circuit 120 and a voltage division circuit 210. The programmable circuit 120 may output various signals S1, S2, ..., and Sn according to a programming state. Each of the signals S1, S2, ..., and Sn may be one of a logic "H" signal and a logic "L" signal. The voltage division circuit 210 may output various output voltages V1, V2, ..., and Vn in response to various signals S1, S2, ..., and Sn of the programmable circuit 120. The voltage division circuit 210 may receive a voltage having a predetermined level from an internal voltage generator (IVG), divide the received voltage into voltages having various levels, and output the divided voltages.

Figure 12:
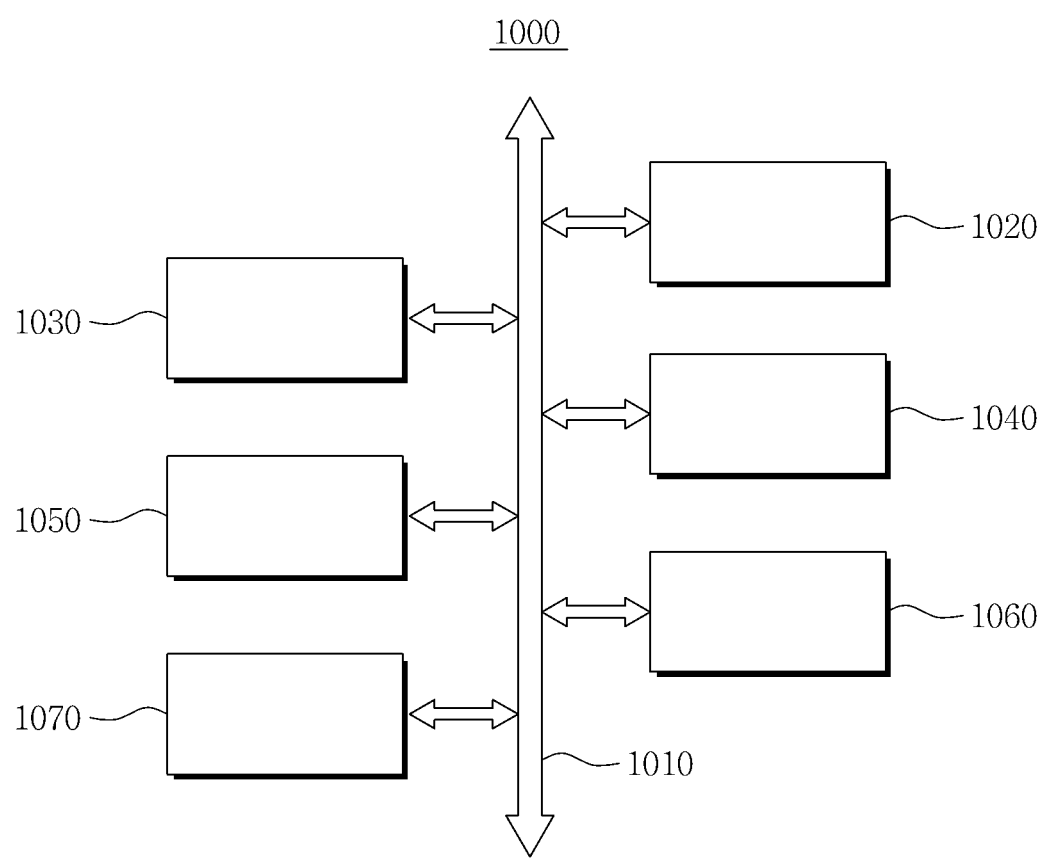
FIG. 12 is a conceptual block diagram of an electronic system according to exemplary embodiments of the present general inventive concept.

FIG. 12 is a conceptual block diagram of an electronic system according to applied exemplary embodiments of the present general inventive concept.

Referring to FIG. 12, an electronic system 1000 may include a bus 1010, a sensing unit 1020 capable of communicating input and output (I/O) signals through the bus 1010, a central processing unit (CPU) 1030, and an I/O unit 1040. The electronic system 1000 may further include a memory drive 1050. The electronic system 1000 may further include an optical disc drive (ODD) 1060. The electronic system 1000 may further include a communication unit 1070. The CPU 1030 may include a microprocessor (MP). The I/O unit 1040 may include one of various input devices including an operating button, a switch, a keyboard, a mouse, a keypad, a touch pad, a scanner, a camera, or an optical sensor or include one of a liquid crystal display (LCD), a light-emitting diode (LED) and/or a cathode-ray tube (CRT) monitor, a printer, and/or a display unit configured to show various pieces of visual information. The memory drive 1050 may include a dynamic random access memory (DRAM), a static random access memory (SRAM), a phase-changeable random access memory (PRAM), a resistive random access memory (RRAM), a magnetic random access memory (MRAM), a non-volatile memory (NVM), a flash memory, a solid-state disk (SSD), a hard disk (HD), and/or various memory devices, or drives thereof. The ODD 1060 may be, for example, a compact-disc read-only-memory (CD-ROM) drive or a digital versatile disc (DVD) drive. The communication unit 1070 may include a modem, a local area network (LAN) card, or a universal serial bus (USB) or include an external memory, a wireless broadband Internet (WiBro) communication unit, or an infrared (IR) communication unit. One of the sensing unit 1020, the CPU 1030, the I/O unit 1040, the memory drive 1050, the ODD 1060, and/or the communication unit 1070 may include a programmable circuit according to the present general inventive concept or a semiconductor device including the programmable circuit.

Figure 13:
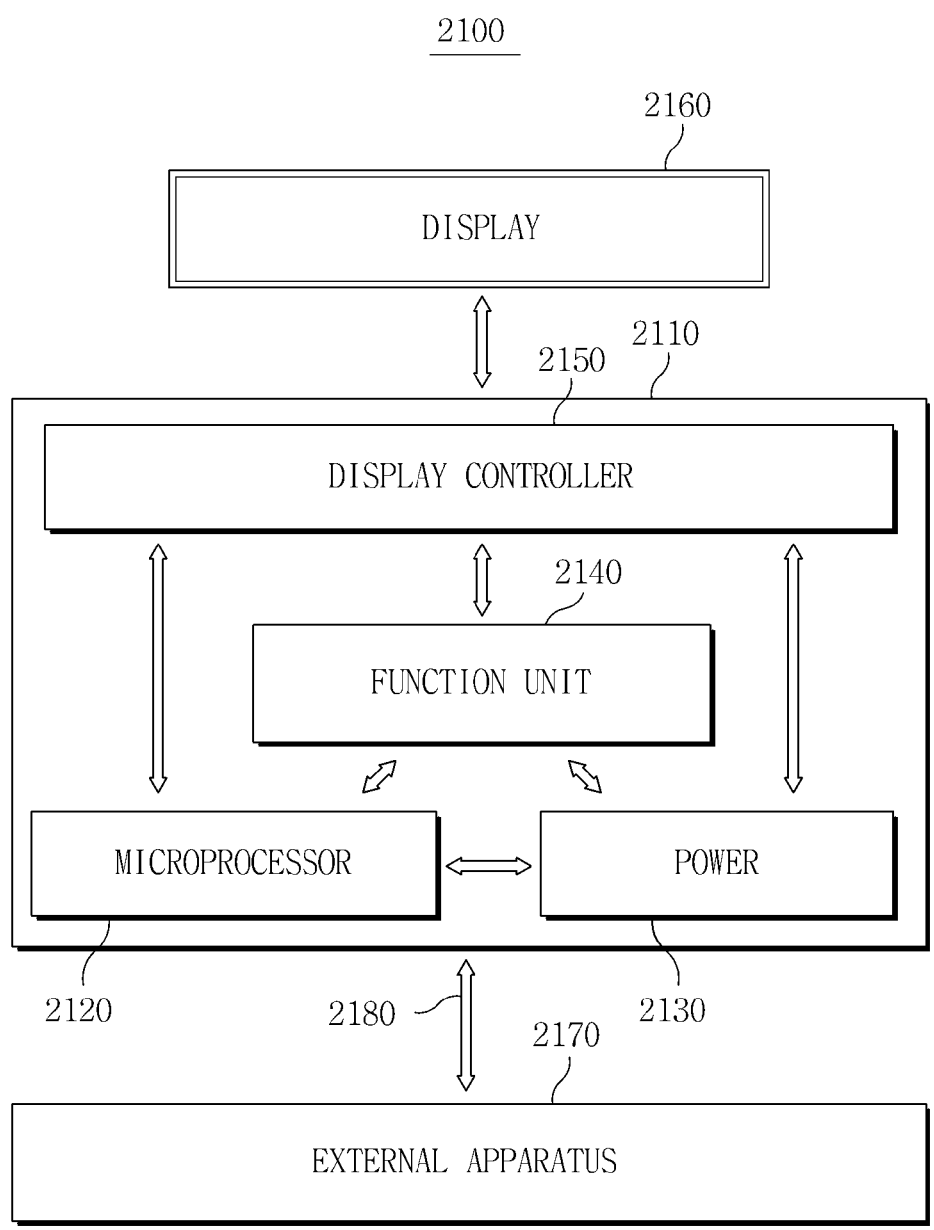
FIG. 13 is a conceptual block diagram of an electronic system according to other applied exemplary embodiments of the present general inventive concept.

FIG. 13 is a conceptual block diagram of an electronic system according to other applied exemplary embodiments of the present general inventive concept.

Referring to FIG. 13, an electronic system 2100 may be an electronic device. The electronic system 2100 may include a body 2110, a microprocessor (MP) unit 2120, a power unit 2130, a function unit 2140, and/or a display controller unit 2150. The body 2110 may be a system board or motherboard having a printed circuit board (PCB). The MP unit 2120, the power unit 2130, the function unit 2140, and the display controller unit 2150 may be mounted or installed on the body 2110. A display unit 2160 may be disposed on a top surface of the body 2110 or outside the body 2110. For instance, the display unit 2160 may be disposed on a surface of the body 2110 and display an image processed by the display controller unit 2150.

The power unit 2130 may receive a predetermined voltage from an external power source, divide the predetermined voltage into voltages having various voltage levels, and supply the divided voltages to the MP unit 2120, the function unit 2140, and the display controller unit 2150. The MP unit 2120 may receive a voltage from the power unit 2130 and control the function unit 2140 and the display unit 2160. The function unit 2140 may serve various functions of the electronic system 2100. For example, when the electronic system 2100 is a mobile electronic product, such as a portable phone, the function unit 2140 may include several components capable of wireless communication functions, such as the output of an image to the display unit 2160 or the output of voices to a speaker, by dialing or communication with an external apparatus 2170. When the function unit 2140 includes a camera, the function unit 2140 may serve as an image processor.

In other applied exemplary embodiments, when the electronic system 2100 is connected to a memory card to increase the capacity of the electronic system 2100, the function unit 2140 may be a memory card controller. The function unit 2140 may transmit and receive signals to and from the external apparatus 2170 through a wired or wireless communication unit 2180. In addition, when the electronic system 2100 needs a USB to expand functions thereof, the function unit 2140 may serve as an interface controller.

Each of the MP unit 2120, the power unit 2130, the function unit 2140, and/or the display controller unit 2150 may include a programmable circuit according to the present general inventive concept or a semiconductor device including the programmable circuit.

In addition, the names and functions of unshown or undescribed components may be easily understood with reference to other drawings of the specification and descriptions thereof.

A programmable/programmed circuit and semiconductor device/electronic system having the programmable circuit according to various exemplary embodiments of the present general inventive concept may be electrically programmed. Thus, as compared with a conventional programming method using a laser, pre- and post-processing operations may be omitted and the entire process may be simplified. Also, since a programmable/programmed circuit and a semiconductor device/electronic system having the programmable circuit according to various exemplary embodiments of the present general inventive concept may be programmed using a voltage, reliability of results may be enhanced more than when it is programmed using current. For example, in a circuit programmed using a voltage, a current difference between two current paths to be differentially amplified may be greater than in a circuit programmed using current. In other words, the circuit programmed using the voltage may have not only higher reliability but also a higher circuit operating speed than the circuit programmed using the current. In addition, the circuit programmed using the voltage may cause neither the likelihood of overheating nor migration caused by current as compared with the circuit programmed using the current. Therefore, the circuit programmed using the voltage may not detrimentally affect other components.

Although a few exemplary embodiments of the present general inventive concept have been shown and described, it will be appreciated by those skilled in the art that changes may be made in these exemplary embodiments without departing from the principles and spirit of the present general inventive concept, the scope of which is defined in the appended claims and their equivalents.

What is claimed is:

1. A programmable circuit comprising:
a first path and a second path connected in parallel between a first voltage node and a second voltage node;
wherein the first path includes a first programmable element, a first node, a first pull-up transistor, a second node, and a first pull-down transistor connected in series between the first voltage node and the second voltage node;
the second path includes a second programmable element, a third node, a second pull-up transistor, a fourth node, and a second pull-down transistor connected in series between the first voltage node and the second voltage node;
a drain electrode of a first input transistor is electrically connected to the third node;
a gate electrode of the first pull-up transistor, a gate electrode of the first pull-down transistor, and the fourth node are electrically connected to one another; and
a gate electrode of the second pull-up transistor, a gate electrode of the second pull-down transistor, and the second node are electrically connected to one another.

2. The circuit of claim 1, wherein the first programmable element includes a first programmable field-effect transistor (FET).

3. The circuit of claim 2, wherein the first programmable FET includes a gate electrode, a source electrode, a drain electrode, and a bulk,
the gate electrode of the first programmable FET is electrically connected to the first voltage node,
and the bulk of the first programmable FET is electrically connected to the first node.

4. The circuit of claim 3, wherein the source and drain electrodes of the first programmable FET are electrically connected to the bulk of the first programmable FET.

5. The circuit of claim 1, wherein the second programmable element includes a second programmable FET.

6. The circuit of claim 5, wherein the second programmable FET includes a gate electrode, a source electrode, a drain electrode, and a bulk,
the gate electrode of the second programmable FET is electrically connected to the first voltage node,
and the bulk of the second programmable FET is electrically connected to the third node.

7. The circuit of claim 6, wherein the source and drain electrodes of the second programmable FET are electrically connected to the bulk of the second programmable FET.

8. The circuit of claim 1, further comprising a second input transistor having a drain electrode electrically connected to the first node.

9. The circuit of claim 1, further comprising an output transistor having a source electrode electrically connected to the fourth node.

10. The circuit of claim 1, further comprising a first setting transistor electrically connected between the second node and the second voltage node.

11. The circuit of claim 10, further comprising a second setting transistor electrically connected between the fourth node and the second voltage node.

12. The circuit of claim 1, further comprising a complementary output node electrically connected to the fourth node, the complementary output node including an inverter.

13. A programmable circuit comprising:
a differential amplifier circuit including a common voltage node, a first pull-up transistor, and a second pull-up transistor;
a first programmable element electrically connected between the common voltage node and the first pull-up transistor; and
a second programmable element electrically connected between the common voltage node and the second pull-up transistor, and
wherein the first programmable element includes a first FET, the second programmable element includes a second FET, the first FET includes a first gate electrode electrically connected to the common voltage node and a first bulk electrically connected to the first pull-up transistor, and the second FET includes a second electrode electrically connected to the common voltage node and a second bulk electrically connected to the second pull-up transistor.

14. A programmable circuit comprising:
a voltage node to receive at least one of a program voltage and a supply voltage;
a first input switching element to supply a breakdown voltage in response to a turn-on signal;
a second input switching element to supply an inhibition voltage in response to the turn-on signal;
a first programmable element electrically connected between the voltage node and the second input switching element, and including a first insulating layer that is sustained based on the program voltage and the inhibition voltage; and
a second programmable element electrically connected between the voltage node and the first input switching element, and including a second insulating layer that is broken down based on the program voltage and the breakdown voltage.

15. The programmable circuit of claim 14, wherein the first programmable element effects a virtual open circuit between the voltage node and the second input switching element, and the second programmable element effects a virtual short circuit between the voltage node and the first input switching element.

16. The programmable circuit of claim 15, further comprising:
a reference voltage node to receive a reference voltage;
a first transistor combination disposed between the second input switching element and the reference voltage node, the first transistor combination including a first pull-up transistor and a first pull-down transistor connected in series with each other to define a first logic node therebetween; and
a second transistor combination disposed between the first input switching element and the reference voltage node, the second transistor combination including a second pull-up transistor and a second pull-down transistor connected in series with each other to define a second logic node therebetween.

17. The programmable circuit of claim 16, further comprising a setting switching element connected to the first node.

18. The programmable circuit of claim 16, wherein respective gates of the second pull-up transistor and second pull-down transistor are connected to the first logic node, and respective gates of the first pull-up transistor and first pull-down transistor are connected to the second logic node, and
wherein the programmable circuit further comprises an output switching element connected to the second logic node to output a reliable logic high state in response to being activated.

* * * * *